United States Patent [19]

Sudo et al.

[11] Patent Number: 5,025,448
[45] Date of Patent: Jun. 18, 1991

[54] METHOD AND APPARATUS FOR STABILIZING FREQUENCY OF SEMICONDUCTOR LASER

[75] Inventors: Shoichi Sudo, Atsugi; Yoshihisa Sakai, Yokohama; Hiroshi Yasaka, Zama; Tetsuhiko Ikegami, Tokyo; Yuzo Yoshikuni, Kawasaki; Itaru Yokohama, Zama; Kenichi Kubodera, Isehara, all of Japan

[73] Assignee: Nippon Telegraph & Telephone Corporation, Tokyo, Japan

[21] Appl. No.: 492,716

[22] Filed: Mar. 13, 1990

[30] Foreign Application Priority Data

May 12, 1989 [JP]  Japan .................................. 1-117594
Sep. 27, 1989 [JP]  Japan .................................. 1-0249065

[51] Int. Cl.⁵ .............................................. H01S 3/13
[52] U.S. Cl. .................................................... 372/32
[58] Field of Search ...................................... 372/32, 29

[56] References Cited

U.S. PATENT DOCUMENTS

| | | | |
|---|---|---|---|
| 3,593,189 | 7/1971 | Buhrer | 372/32 |
| 3,742,382 | 6/1973 | Smith | 372/32 |
| 3,842,367 | 10/1974 | Schlossberg | 372/32 |
| 3,921,099 | 11/1975 | Abrams et al. | 372/32 |
| 4,829,533 | 6/1989 | Hallberg et al. | 372/32 |
| 4,833,681 | 6/1989 | Akiyama et al. | 372/32 |

Primary Examiner—Frank Gonzalez
Assistant Examiner—Susan S. Morse
Attorney, Agent, or Firm—Frishauf, Holtz, Goodman & Woodward

[57] ABSTRACT

A method of stabilizing the frequency of a semiconductor laser comprises stabilizing a time-dependent frequency fluctuation by utilizing an optical energy absorption medium including an isotope acetylene gas molecule. An apparatus for stabilizing the frequency of a semiconductor laser, comprises a semiconductor laser, an optical energy absorption medium, a photodetector and a control circuit as essential elements. The optical energy absorption medium includes an isotope acetylene molecule.

20 Claims, 17 Drawing Sheets

F I G. 15
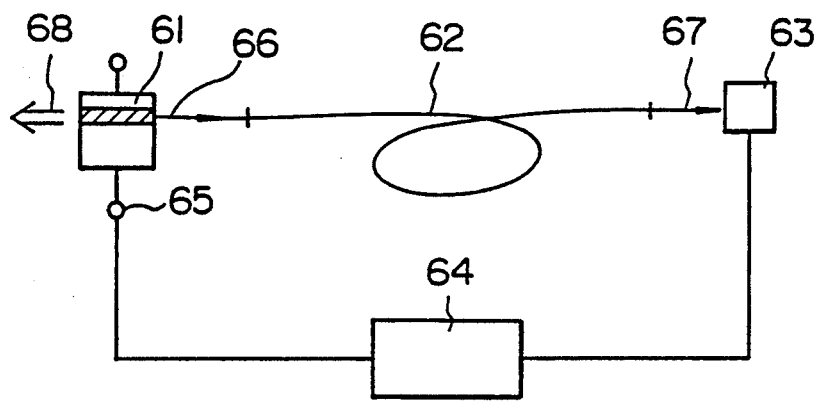
F I G. 16(a)
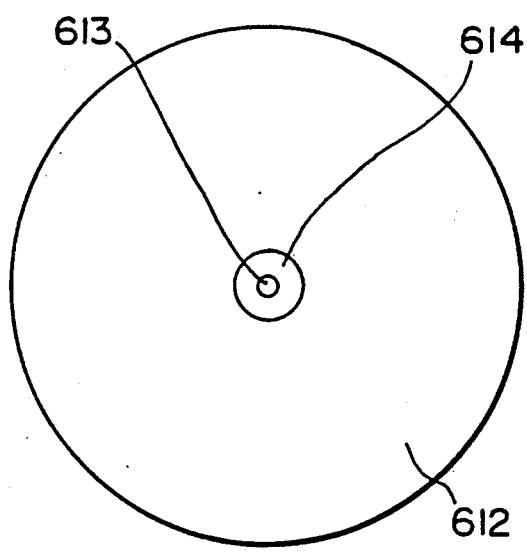
F I G. 16(b)
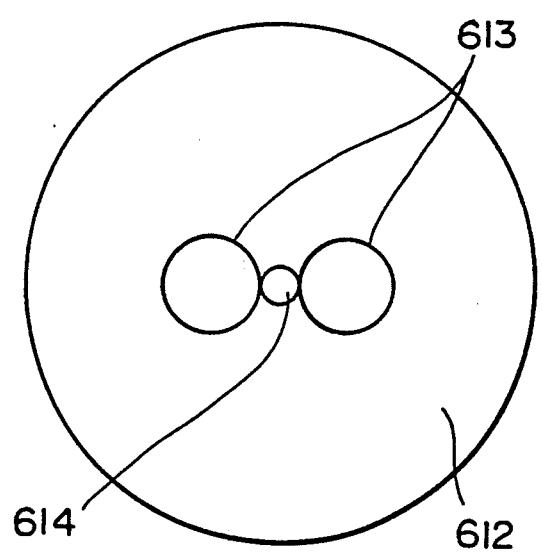

METHOD AND APPARATUS FOR STABILIZING FREQUENCY OF SEMICONDUCTOR LASER

BACKGROUND OF THE INVENTION

1. Field of the Invention

The present invention relates to a method of stabilizing the frequency of a semiconductor laser to a predetermined frequency precisely and an apparatus for practicing the method.

2. Description of Related Arts

Light source for semiconductor laser or laser diode whose frequency is stabilized to a specified frequency plays an important role in frequency division multiplexing coherent transmission system or high-resolution optical measurement which makes use of characteristics of light as wave as described in K. Nosu et al.; IEEE, J. Light Wave Technology, Vol. LT-5, pp. 1301-1308 (1987), and Ohkoshi and Kikuchi; "Kohirento Hikari Tsushin Kogaku" (English translation: Coherent Light Communication Engineering), Ohm Co., Tokyo, 1989.

As for the method of stabilizing the frequency of semiconductor laser diodes, there have been known various methods such as a method in which a Fabry Perot resonance oscillator (cf. A. Solberger et al.; IEEE, J. Light Wave Technology, Vol. LT-5, pp. 485-491 (1987), for example.), a method in which use is made of light absorption spectrum of an element such as rubidium (Rb) which appears when energy transition takes place.(cf H. Tsuchida et al.; Japan J. Appl. Phys., Vol. 21, pp. L1-L3 (1982), and the like.

However, these conventional methods have various problems that precision of frequency stabilized is poor, it is difficult to assure stabilization of frequency over a long period of time, and it needs apparatus of a large size as well as that the wavelength region which can be stabilized is limited only to a range of from 0.8 $\mu$m to 1.3 $\mu$m. Among them the lastly mentioned problem concerning limited range of stabilizable wavelength region is particularly important and explanation will be helpful. That is, in light communication technique put into practice in telephone and data communication and that which is now under development such as frequency division multiplexing coherent transmission system referred to above, the wavelength region mainly used is 1.5 $\mu$m wavelength region, more strictly a wavelength region centered at 1.55 $\mu$m at which transmission loss of single mode optical fiber is minimum. At the wavelength of 1.55 $\mu$m single mode optical fibers show minimum transmission loss (i.., maximum transmission) so that there can be attained maximal elongation of the distance of light transmission via optical fiber system without relays or the length of optical fiber between relays, which is advantageous for long distance light transmission on land or submarine light transmission. Therefore, there is a keen need for developing a light source for semiconductor laser in which frequency is stabilized at a wavelength region of 1.5 $\mu$m, particularly at a wavelength near 1.55 $\mu$m. At the same time, this light source must be small and highly stabilized from practical viewpoint.

Various methods have heretofore been known in which the frequency of semiconductor laser diode is stabilized in a wavelength region of 1.5 $\mu$m. Firstly, there is a method in which there are used optical absorption lines of ammonia ($NH_3$) molecule which has several optical absorption lines in the wavelength region of 1.5 $\mu$m (cf. M. Ohtsu et al.; Japan J. Appl. Phys., Vol. 22, pp 1553-1557 (1983), and T. Yanagawa et al.; Appl. Phys. Lett., Vol. 45, No. 8, pp 826-828 (1984)). In this method, the optical absorption line of ammonia at a wavelength of 1.519 $\mu$m (i.e., the strongest optical absorption line) is utilized to stabilize the frequency of distributed feedback laser diode. In this case, there are problems that even at that wavelength (1.519 $\mu$m) the intensity of optical absorption by ammonia molecule is low and therefore a long cell as long as 50 cm to 1 m is necessary for the frequency stabilization, which means that the size of apparatus is large, as well as that stability for a long period time is poor. Furthermore, optical absorption lines at wavelengths other than 1.519 $\mu$m show much lower intensity of absorption and therefore it is difficult to stabilize the frequency of semiconductor laser diode at a wavelength near 1.55 $\mu$m referred to above.

Next, there is known a method of stabilizing the frequency of semiconductor laser diode utilizing optogalvanic effect in which voltage is generated when light with a wavelength of 1.533 $\mu$m is irradiated to a hollow cathode lamp enclosing krypton (Kr) (cf. Y. C. Chung et al; Electronics Letters, Vol. 24, pp 1048-1049 (1988)). One problem of this method is that the life time of a hollow cathode lamp is limited to about 500 hours and another problem is that the wavelength which can be stabilized is limited to 1.533 $\mu$m.

Recently, a third method has been proposed in which the frequency of distributed feedback laser diode with a wavelength of 1.56 $\mu$m is stabilized utilizing optical absorption line of rubidium (Rb) at 0.78 $\mu$m after converting the wavelength of a semiconductor laser with a frequency of 1.56 $\mu$m by using a wavelength conversion element (such as elements comprised by $LiNbO_3$, KTP, or $LiIO_3$) to a wavelength half as long as that of the original wavelength (0.78 $\mu$m) (cf. M. Ohtsu et al.; Technical Digest of Conference on Lasers and Electro-Optics, p 52 (1989)). In this method, light output obtained by converting the wavelength of a semiconductor laser with a wavelength of 1.56 $\mu$m is weak, e.g., as weak as several picowatts (pW, i.e., $1/10^{12}$ W) and therefore it is necessary to use a ultrahigh sensitive light receptor (e.g., a photomultiplier). Thus, the method has problems in practically acceptable stability and reduction of size of apparatus used.

As the most prominent approach for solving the above-described problems, there has been studied a method in which absorption line of acetylene ($C_2H_2$) molecule is utilized (cf. S. Kinugawa et al.; "Detection of $C_2H_2$ absorption lines with 1.5 $\mu$m DFB lasers", 49th Conference of Japan Applied Physics Society, Preliminary Print, p. 815 (1988)). However, the literature describes only results of measurement on absorption line of acetylene but does not contain idea of frequency stabilization of semiconductor lasers. It reports that acetylene has many intense, sharp absorption lines in a wavelength region of from 1.510 $\mu$m to 1.525 $\mu$m centering around 1.520 $\mu$m, and in a wavelength region of from 1.525 $\mu$m to 1.540 $\mu$m centering around 1.530 $\mu$m.

FIG. 2 is a graph showing optical absorption characteristics of $C_2H_2$ molecule measured by the present inventors. Although acetylene molecule has a lot of intense, sharp absorption lines in a wavelength region of from 1.51 $\mu$m to 1.54 $\mu$m, the intensity of absorption of absorption lines is low in a wavelength region of longer than 1.54 $\mu$m. Therefore, it is very difficult to maintain optical absorption intense enough to stabilize the frequency of semiconductor laser at 1.55 μm which is practically important as described above. For example, when a cell enclosing acetylene gas at 10 Torr is used, the cell must be 1 m long in order to maintain intensity of absorption at 1.541 μm at a level of 20%, with the result that it is difficult to reduce the size of apparatus to be used and achieve high degree of stabilization. Therefore, even with a method utilizing absorption lines of acetylene molecule, it is very difficult to provide practically acceptable light source for semiconductor lasers which can give stabilized frequency at a wavelength near 1.55 μm.

SUMMARY OF THE INVENTION

An object of the present invention is to solve various problems of the conventional techniques and provide a method of stabilizing the frequency of semiconductor laser precisely in a wavelength region of from 1.52 μm to 1.57 μm, which is important in light transmission techniques, optical measurement techniques, optical memory techniques and the like, particularly from 1.54 μm to 1.56 μm centering around 1.55 μm, and an apparatus for practicing the method.

Another object of the present invention is to provide a practically useful frequency-stabilized semiconductor laser apparatus which is small in size, and excellent in the precision of frequency stabilization and stabilization over a long period of time.

As the result of intensive investigation, it has now been found that the above-described objects of the present invention are attained by the use of isotope-replaced acetylene as a gas for use in a method of stabilizing time-dependent frequency fluctuation by utilizing absorption lines of gas molecule.

Therefore, the present invention provides a method of stabilizing frequency of a semiconductor laser, comprising stabilizing time-dependent frequency fluctuation by utilizing an absorption line of a gas molecule, wherein said gas molecule is isotope acetylene molecule.

In another aspect, the present invention provides an apparatus for stabilizing frequency of a semiconductor laser, comprising a semiconductor laser, an optical absorptional material, a photodetector and a control circuit, wherein said optical absorptional material has optical absorption characteristics utilizing an absorption line of an isotope acetylene molecule.

According to the present invention, the frequency of semiconductor lasers can be stabilized in a wavelength region of from 1.52 μm to 1.57 μm with high precision.

BRIEF DESCRIPTION OF THE DRAWINGS

FIG. 15 is a schematical illustration of an apparatus for stabilizing frequency of a semiconductor laser according to the sixth embodiment of the present invention;

FIGS. 16(a) and 16(b) each are a transverse cross-section of an optical absorptional fiber which can be used in the present invention;

DETAILED DESCRIPTION OF THE INVENTION

Figure 1:
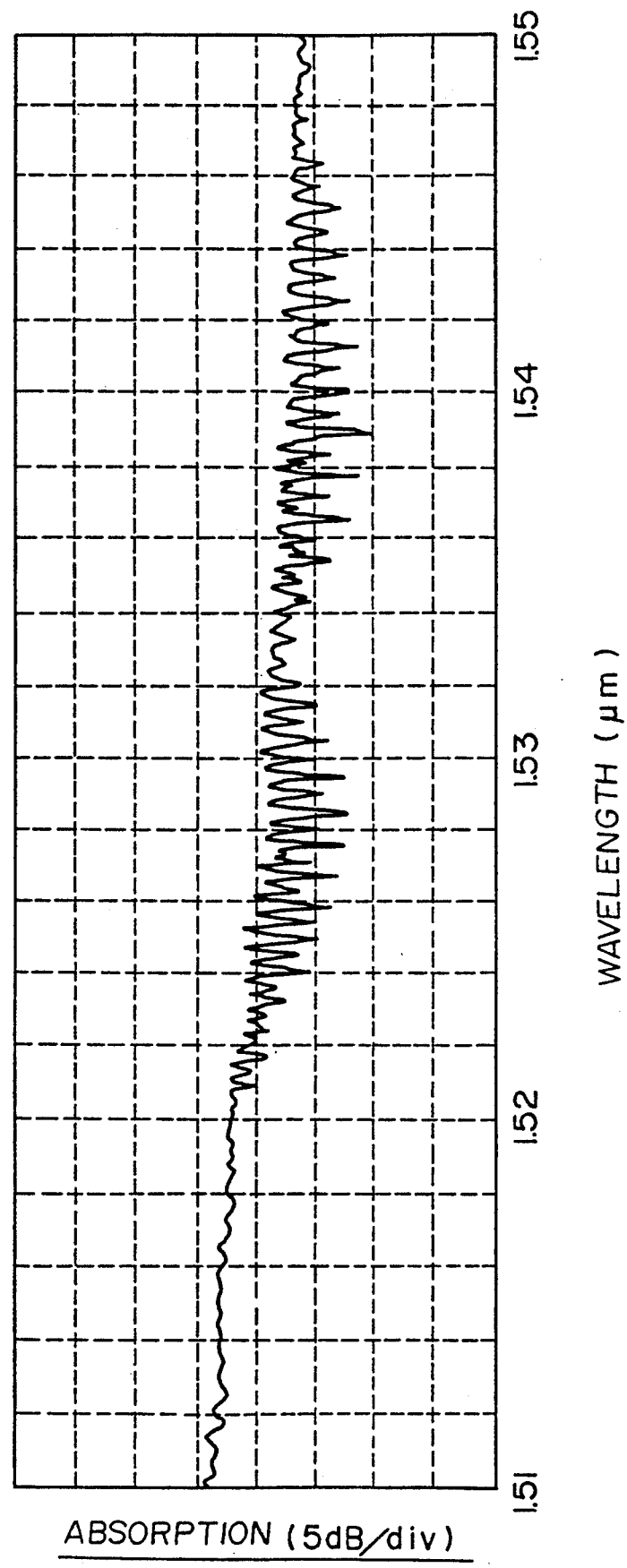
FIG. 1 is graph representing a characteristic curve of absorption lines of $^{13}C_2H_2$ gas molecule, which is one of isotope acetylenes.

In the method of stabilizing frequency of a semiconductor laser and apparatus therefor according to the present invention, isotope acetylenes are used in place of $NH_3$ gas molecule or $C_2H_2$ gas molecule used in conventional frequency stabilization methods.

The isotope acetylene molecules which can be used in the present invention are those in which at least one carbon atom or hydrogen atom in non-isotope-replaced acetylene ($C_2H_2$ where C indicates a carbon atom $^{12}C$ having an atomic weight of 12, and H stands for a hydrogen atom $^1H$ having an atomic weight of 1) is replaced by an isotope carbon atom or hydrogen atom such as a $^{13}C$ atom having an atomic weight of 13, a $^{14}C$ atom having an atomic weight of 14, a deuterium atom (D or $^2H$) having an atomic weight of 2, or a tritium atom (T or $^3H$) having an atomic weight of 3. Typical examples of the isotope acetylene molecules which can be used in the present invention include $^{13}C_2H_2$, $C_2HD$, $^{13}C_2HD$, etc. This substitution with isotopes makes the optical absorption characteristics of the gas molecule concerned different than ever.

Difference in optical absorption characteristics will be described below taking usual acetylene ($C_2H_2$) and one of isotope acetylene ($^{13}C_2H_2$) as examples.

That is, $C_2H_2$ type molecules have a molecular structure of H—C≡C—H, and their absorption characteristics depend basically on optical absorption due to vibration of H—C bond and rotation of the molecule. Since $^{12}C$ which constitutes non-isotope acetylene molecule and $^{13}C$, isotope, have different atomic weights, resonant frequency of vibration of H—C bond (i.e., wavelength at which optical absorption occurs) differs between the two carbon species; absorption wavelength of H—$^{13}C$ bond is slightly shifted toward longer wavelength side as compared with that of H—$^{12}C$ bond. That is, the larger the atomic weight of $^{13}C$ as compared with $^{12}C$, the longer the absorption wavelength of $^{13}C$.

From this it follows that non-isotope acetylene ($^{12}C_2H_2$) molecule and an isotope acetylene ($^{13}C_2H_2$) molecule are different molecules having different optical absorption characteristics. Similarly, other isotope acetylene molecules are different from non-isotope acetylene. Hereinafter, non-isotope acetylene is indicated by formula $C_2H_2$ since it is common sense in chemistry that unless otherwise indicated C stands for $^{12}C$. Therefore, utilization of the isotope acetylene molecules in frequency stabilization of a semiconductor laser is a sophisticated technique and obviously an indefinite description, e.g., mere reference to the use of "acetylene" does not imply the present invention which uses an isotope acetylene molecule.

The basic feature of the present invention resides in the fact that the wavelength region in which optical absorption occurs is successfully shifted toward a wavelength region which is practically important. This shift of absorption wavelength region has been achieved by precise calculation of optical absorption characteristics and overcome various problems described above with respect to stabilization wavelength encountered when frequency stabilization of a semiconductor laser is contemplated using non-isotope acetylene molecule.

Next, optical absorption characteristics of isotope acetylene molecule will be described below.

FIG. 1 is a graph representing optical absorption characteristics of $^{13}C_2H_2$ gas molecule as an example of the optical absorption characteristics of isotope acetylene molecule which is used in the present invention. In the case of the isotope acetylene molecule shown in FIG. 1, it has a lot of intense, sharp absorption lines in a wavelength region of from 1.52 μm to 1.55 μm.

Figure 2:
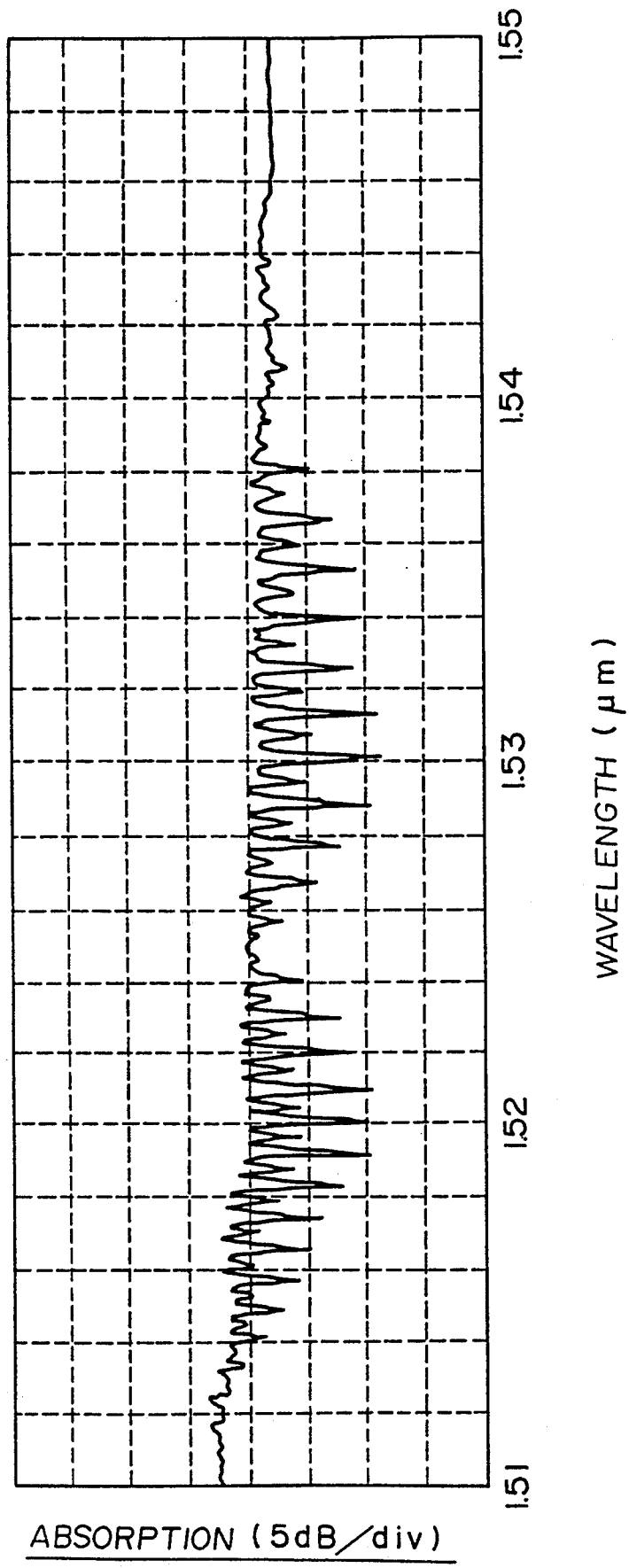
FIG. 2 is a graph representing a characteristic curve of absorption lines of non-isotope acetylene ($C_2H_2$) gas molecule conventionally used.

Comparing the optical absorption characteristics of non-isotope acetylene shown in FIG. 2 and that of isotope acetylene molecule shown in FIG. 1, particular attention is directed to the positions of absorption lines. In the case of $C_2H_2$, absorption lines are composed of a group of absorption lines in a wavelength region of from 1.520 μm to 1.525 μm centering around about 1.520 μm and another group of absorption lines in a wavelength region of from 1.525 μm to 1.540 μm centering around about 1.530 μm. On the other hand, $^{13}C_2H_2$ molecule has absorption lines composed of a group of absorption lines in a wavelength region of from 1.520 μm to 1.533 μm centering around about 1.527 μm and another group of absorption lines in a wavelength region of from 1.533 μm to 1.550 μm centering around about 1.540 μm.

As described above, isotope acetylene gas molecule shows absorption lines at wavelengths clearly different from those of non-isotope acetylene gas molecule. Therefore, it is possible to stabilize frequency of a semiconductor laser at a specified wavelength which is different from a wavelength at which frequency stabilization is performed using $C_2H_2$. In particular, in the case of using $^{13}C_2H_2$, intense absorption lines are obtained in a wavelength region of from 1.540 μm to 1.55 μm where no absorption lines can be obtained with non-isotope acetylene ($^{12}C_2H_2$) gas molecule, and frequency stabilization of a semiconductor laser can be performed in a wavelength region of from 1.54 μm to 1.55 μm, which is practically important in optical transmission techniques as described before.

Figure 3:
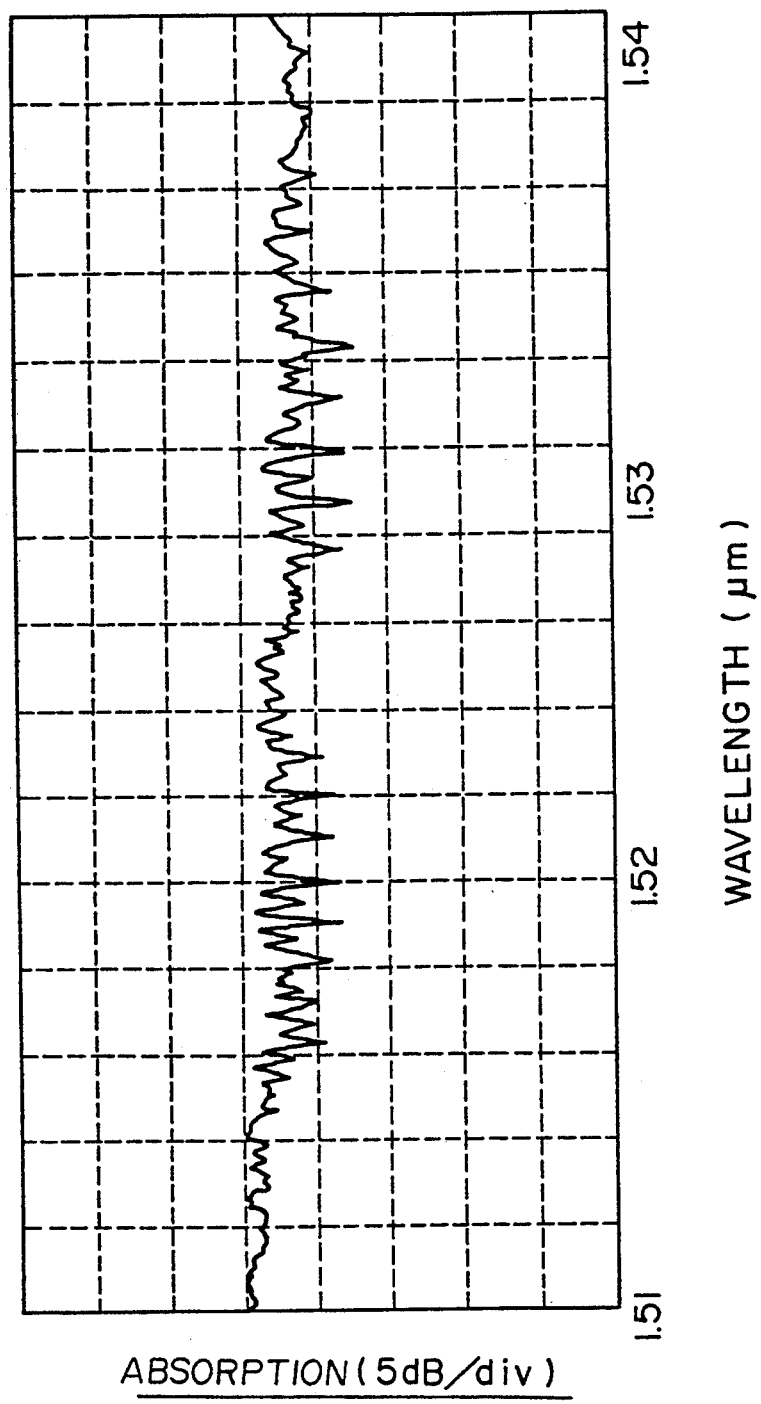
FIG. 3 is a graph representing a characteristic curve of absorption lines of $C_2HD$ gas molecule, one of isotope acetylenes.

FIG. 3 is a graph representing optical absorption characteristics of $^{12}C_2HD$, one of isotope acetylene molecule. In the case of $^{12}C_2HD$ gas molecule, too, there ca be obtained optical absorption characteristics different from those of non-isotope acetylene ($^{12}C_2H_2$) shown in FIG. 2. Therefore, this isotope acetylene also permits frequency stabilization of a semiconductor laser at a specified wavelength which is different from that of non-isotope acetylene.

Furthermore, $^{13}C_2HD$ gas molecule, which is derived by replacing the carbon atoms by $^{13}C$ and one hydrogen atom by a deuterium atom (D), have absorption lines at wavelengths different from those at which non-isotope acetylene gas molecule has absorption lines, and therefore frequency of a semiconductor laser can be stabilized at a wavelength of an absorption line specific to $^{13}C_2HD$ gas molecule.

In the case of $^{14}C_2H_2$, absorption lines appear in a wavelength region of from 1.53 μm to 1.57 μm. Therefore, frequency of a semiconductor laser can be stabilized in that wavelength region.

The isotope acetylene gas molecules can be synthesized by reaction of calcium carbide with water or high temperature cracking of methane. For example, $^{13}C_2H_2$ can be prepared by carbide method. The reaction scheme is as follows.

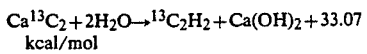
$$Ca^{13}C_2 + 2H_2O \rightarrow {}^{13}C_2H_2 + Ca(OH)_2 + 33.07 \text{ kcal/mol}$$

More particularly, powder of carbide ($Ca^{13}C_2$) is charged in an Erlenmeyer flask sealed with a rubber stopper and a small amount of water ($H_2O$) is added thereto to form $^{13}C_2H_2$ gas. This gas is introduced and stored in a glass container connected to the flask via glass tube of a small diameter. The above reaction involves heat generation and it is preferred to cool the flask with a large amount of water to control reaction rate and prevent elevation of temperature inside the flask. In this synthetic method, 1 g of $Ca^{13}C_2$ gives 370 cm³ (1 atm) of $^{13}C_2H_2$ gas.

$C_2HD$ can be synthesized according to the following reaction scheme.

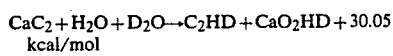
$$CaC_2 + H_2O + D_2O \rightarrow C_2HD + CaO_2HD + 30.05 \text{ kcal/mol}$$

More particularly, hydrolysis of calcium carbide ($CaC_2$) is performed using a mixed liquor of $H_2O-D_2O$ obtained by mixing water ($H_2O$) used in the synthesis of $^{13}C_2H_2$ with equivalent amount of heavy water ($D_2O$). In this case, 1 g of $CaC_2$ gives about 370 cm³ of $C_2HD$.

Isotope acetylene is also obtained by synthesizing isotope methane ($^{13}CH_4$) gas from $^{13}C$ and thermally cracking the isotope methane gas. The reaction proceeds according to the following reaction scheme.

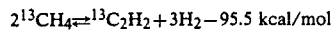
$$2\,^{13}CH_4 \rightleftharpoons {}^{13}C_2H_2 + 3H_2 - 95.5 \text{ kcal/mol}$$

DESCRIPTION OF PREFERRED EMBODIMENTS

The method of stabilizing frequency of a semiconductor laser utilizing absorption lines of an isotope acetylene gas molecule and apparatus therefore will be described in greater detail with reference to preferred embodiments of the present invention. However, it should be understood that the present invention is no limited thereto.

The absorption characteristics have been measured using a spectrometer MA9001S produced by Anritsu Co., Ltd. Absolute value of wavelength includes an error on the order of 0.001 µm. However, this gives no adverse influence on relative comparison of absorption characteristics among various gas molecules.

FIRST EMBODIMENT

Figure 4:
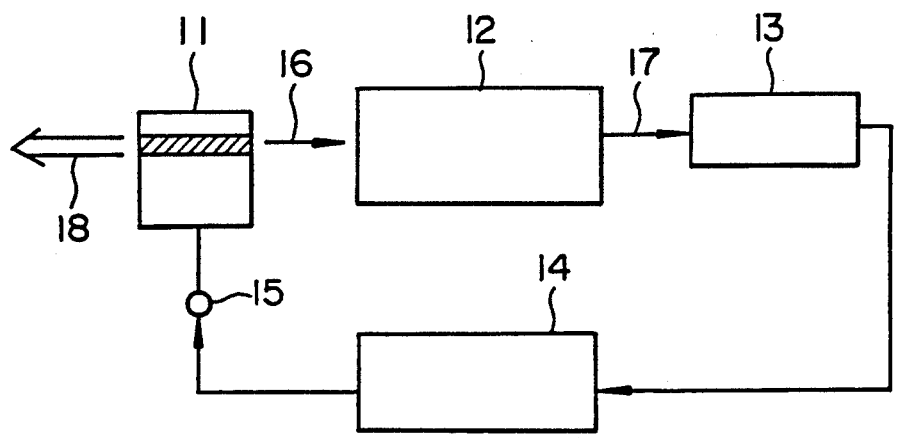
FIG. 4 is a schematic diagram illustrating a first embodiment of the present invention.

FIG. 4 is a schematic diagram illustrating a first embodiment of the present invention. In FIG. 4, reference numeral 11 indicates a semiconductor laser, 12 is a gas cell for optical absorption which is used as an optical absorptional material, 13 is a photodetector, 14 is a control circuit for frequency stabilization (hereafter, referred to simply as "control circuit"), 15 is a terminal for electric current for driving the semiconductor laser 11, 16 is an output light from the semiconductor laser 11, 17 is an output light after passing the gas cell 12, and 18 is a main output light from the semiconductor laser 11. FIG. 4 clearly shows the fundamental construction of the apparatus for stabilizing frequency of a semiconductor laser according to one embodiment of the present invention, in which important feature is the optical absorption gas cell enclosing a gas containing an isotope acetylene gas molecule ($^{13}C_2H_2$).

Referring to FIG. 4, the output light 16 which comes out of the semiconductor laser 11 is passed through the optical absorption gas cell 12 enclosing a gas containing $^{13}C_2H_2$ gas molecule to generate a sharp absorption line at a specified wavelength in a wavelength region of from 1.52 µm to 1.55 µm. Then, the output light 17 from the optical absorption gas cell 12 is sent to the photodetector 13, which detects light and convert it to electric signals. The signals are sent to the control circuit and finally introduced to the drive current terminal 15 of the semiconductor laser 11 as change in drive current (injection current) to alter the frequency of the semiconductor laser 11 slightly and synchronizing it with the sharp absorption line at a specified wavelength by the optical absorption gas cell 12 enclosing a gas containing $^{13}C_2H_2$ gas molecule, thus stabilizing the frequency of the semiconductor laser 11.

For example, in the case where the apparatus shown in FIG. 4 is constituted by using an InGaAsP distributed feedback (DFB) type semiconductor laser which can oscillate in a 1.541 µm wavelength region as the semiconductor laser 11, and a 2 cm-long gas cell enclosing $^{13}C_2H_2$ gas molecule at 20 Torr as the optical absorption gas cell 12, the frequency of the DFB type semiconductor laser thus constructed can be stabilized by utilizing absorption line of $^{13}C_2H_2$ gas molecule at a wavelength of 1.54117 µm. That is, the output light 16 from the semiconductor laser 11 which oscillates in a 1.541 µm wavelength region is introduced in the optical absorption gas cell 12 in which $^{13}C_2H_2$ gas molecule is enclosed under the same conditions as above, with the result that absorption line as shown in FIG. 5 is obtained.

Figure 5:
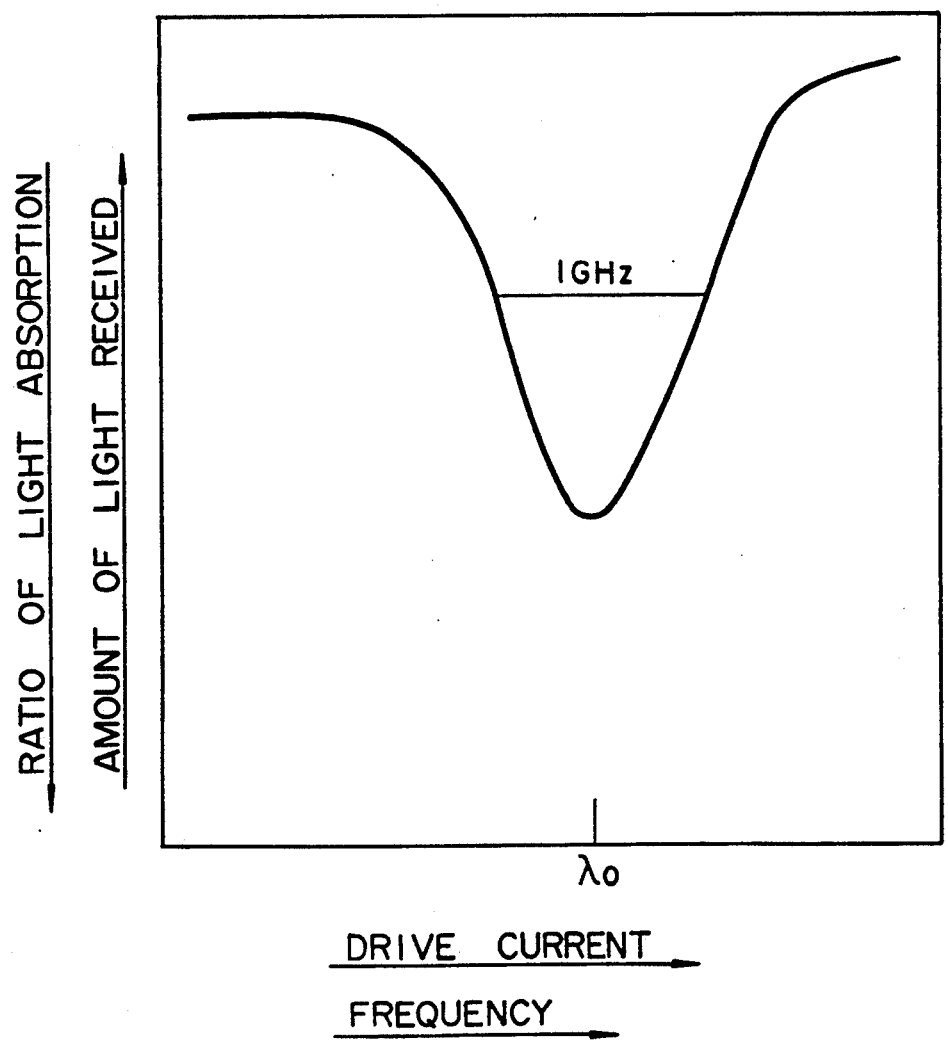
FIG. 5 is a graph illustrating characteristic curve of absorption line at a wavelength near 1.54117 μm of a 2 cm-long gas cell enclosing $^{13}C_2H_2$ gas molecule at 20 Torr; long gas cell en

In FIG. 5, the horizontal axis corresponds to drive current of the semiconductor laser 11 and its frequency, and the vertical axis corresponds to amount of light received by the photo receptor (photodetector) 13 and optical absorption ratio of the optical absorption gas cell 12. If the frequency of the semiconductor laser 11 is shifted from a peak wavelength $\lambda_o = 1.54117$ µm of the absorption line of the $^{13}C_2H_2$ gas-containing gas cell (length: 2 cm, enclosure pressure: 20 Torr) shown in FIG. 5, the amount of light received by the light receptor 13 will increase, which will then cause it to send high output signals to the control circuit 14, resulting in that drive current to be provided by the control circuit 14 to the semiconductor laser 11 will change, and therefore frequency of the semiconductor laser 11 will also change. By repeating this procedure, the frequency of the DFB type semiconductor laser 11 can be tuned to a wavelength at which the amount of light received by the light receptor 13 is minimum, i.e., a wavelength $\lambda_{88}$ at which the optical absorption ratio of the optical absorption gas cell is maximum, and maintained at constant level. In addition, frequency stabilization can be facilitated more by additional means such as modulating the drive current slightly to tune the frequency of the semiconductor laser 11 to a wavelength at which change in the output of the light receptor 13 becomes null, i.e., a peak wavelength $\lambda_o$ of absorption line.

Figure 6:
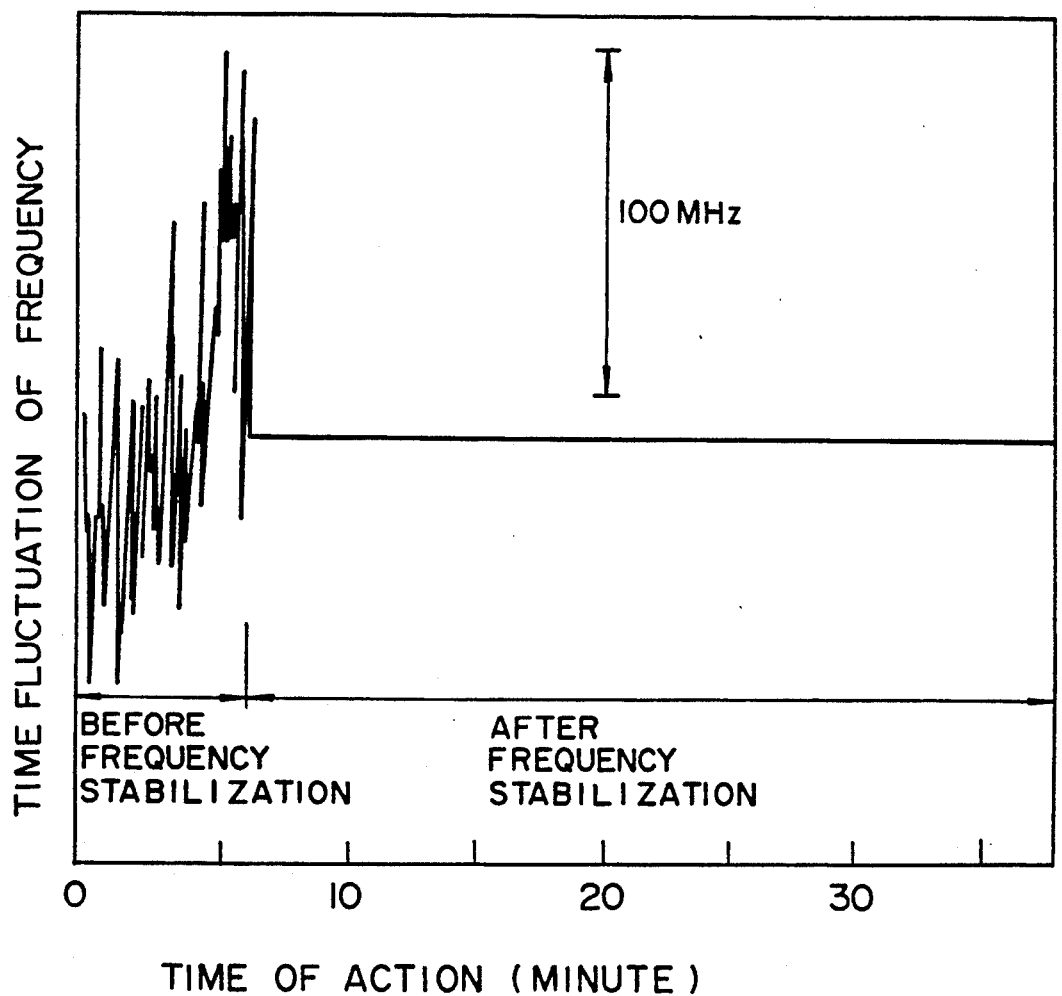
FIG. 6 is a graph which illustrates results of measurement on time-dependent fluctuation of frequency before and after frequency stabilization performed according to the first embodiment of the present invention.

FIG. 6 is a graph which illustrates results of measurement on time-dependent fluctuation of frequency before and after frequency stabilization performed according to the first embodiment of the present invention. By the method of stabilization according to the present invention described above, the width of frequency fluctuation of about 200 MHz before frequency stabilization decreases to no more than 0.5 MHz after frequency stabilization. In a wavelength region of 1.5 μm, a wavelength width of 0.1 nm corresponds to a frequency width of about 1 GHz. Accordingly, a frequency width of 0.5 MHz corresponds to a wavelength width of about $5 \times 10^{-5}$ nm.

Similar frequency stabilization can be performed by utilizing other absorption lines at other specified wavelengths of $^{13}C_2H_2$ gas molecule shown in FIG. 1. For example, similar frequency stabilization can be performed utilizing an absorption line with a wavelength of 1.54949 μm in place of the above-described absorption line with a wavelength of 1.54117 μm. In the case of the absorption line with a wavelength of 1.54949 μm, since the intensity of optical absorption is lower than the absorption line with a wavelength of 1.54117 μm as will be clear from the optical absorption characteristics shown in FIG. 1, it is necessary to increase the length of the cell to about 10 cm. Typically, a 10 cm-long cell enclosing $^{13}C_2H_2$ gas at 20 Torr is used to perform frequency stabilization. As the result, frequency stabilization can be achieved to a frequency stabilization degree of no more than 0.5 MHz.

Similarly, frequency stabilization of a semiconductor laser can be carried out using any absorption line selected from the absorption line of $^{13}C_2H_2$ gas molecule shown in FIG. 1, absorption line of $^{13}C_2H_2$ gas molecule positioned in a wavelength region shorter than 1.52 μm, and absorption line of $^{13}C_2H_2$ gas molecule positioned in a wavelength region longer than 1.55 μm.

SECOND EMBODIMENT

In this embodiment, relationship between the length of a gas cell enclosing $^{13}C_2H_2$ gas and optical absorption ratio, relationship between pressure at which $^{13}C_2H_2$ gas is enclosed and linewidth of absorption line, and temperature dependency of absorption line are elucidated.

Figure 7:
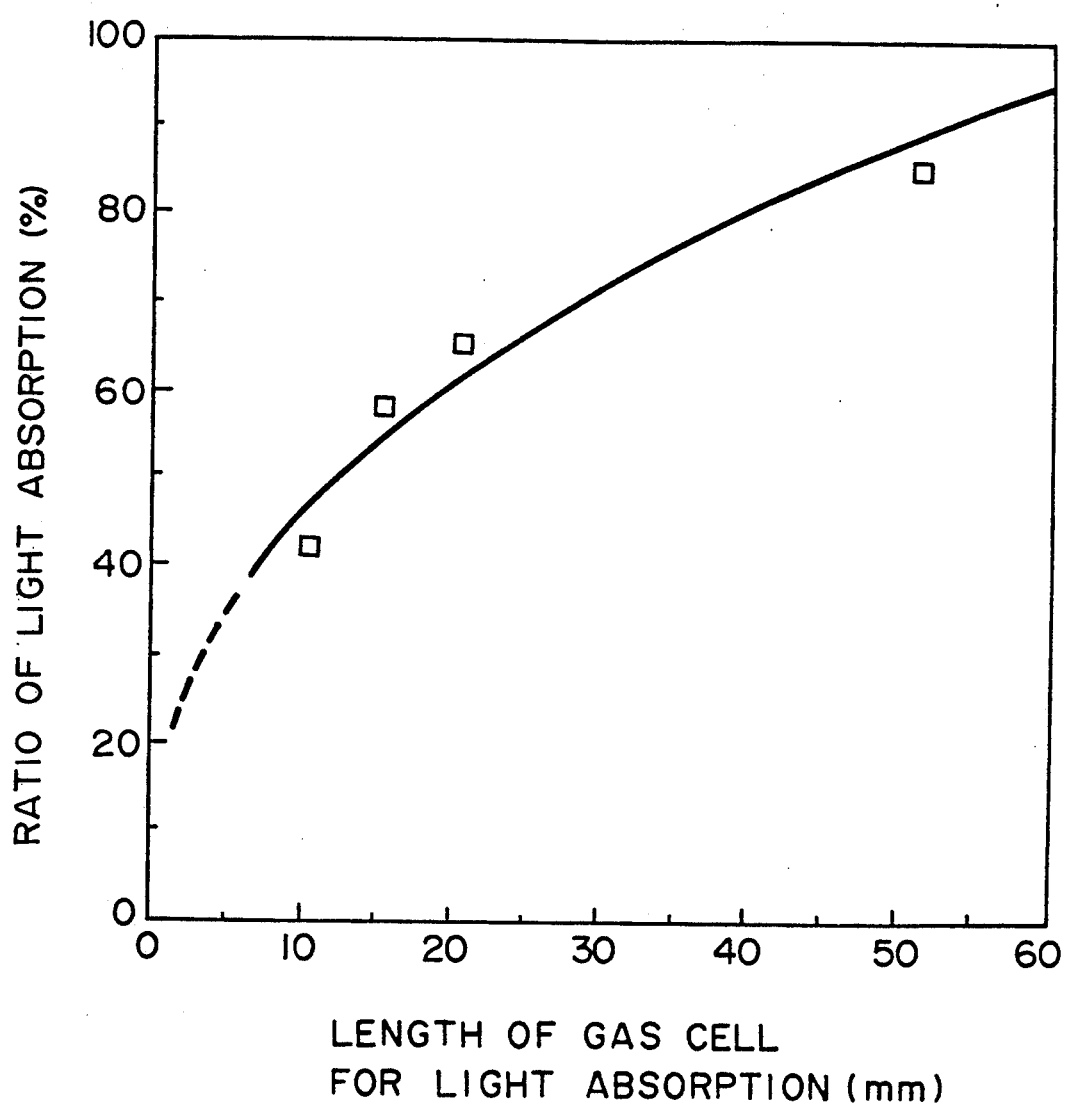
FIG. 7 is a graph illustrating relationship between the length (mm) of a gas cell enclosing $^{13}C_2H_2$ gas at 20 Torr and optical absorption ratio (%) at a wavelength of 1.54117 μm.

FIG. 7 is a graph illustrating relationship between the length (mm) of a gas cell enclosing $^{13}C_2H_2$ gas at 20 Torr and optical absorption ratio (%) at a wavelength of 1.54117 μm. It has been confirmed that optical absorption ratio of no less than 10% is enough to accurately control feedback system centered on the control circuit 14. From FIG. 7, it can be seen that optical absorption ratio of about 40% can be maintained even with a cell of 10 cm long and this ratio is high enough to perform frequency stabilization. Of course, the optical absorption ratio with the same length of a cell increases when the pressure at which $^{13}C_2H_2$ gas molecule is enclosed is elevated to a high value as high as 50 Torr or 100 Torr, for example. In fact, there is obtained ann optical absorption ratio of 50% when a cell is used which is 5 mm long and encloses $^{13}C_2H_2$ gas molecule at 100 Torr.

The relationship between the length of the cell and optical absorption ratio shown in FIG. 7 is one obtained using absorption line with a wavelength of 1.54117 μm. In the case where other absorption lines of $^{13}C_2H_2$ gas molecule shown in FIG. 1 give somewhat different values. That is, absorption lines with absorption intensities higher than absorption line with a wavelength of 1.54117 μm, for example, one with a wavelength of 1.53745 μm or 1.52935 μm can achieve high optical absorption ratio with shorter cell length. On the other hand, in the case where absorption lines with absorption intensities lower than absorption line with a wavelength of 1.54117 μm, a longer cell is required in order to obtain optical absorption ratio of the same level as the absorption line with a wavelength of 1.54117 μm. Therefore, sufficient optical absorption ratio can be maintained using a short cell enclosing $^{13}C_2H_2$ gas molecule at low pressure at a wavelength of absorption line which shows high absorption intensity, but on the contrary, it is necessary to use a longer cell or increase pressure at which isotope acetylene gas molecule is enclosed in order to maintain optical absorption ratio sufficient for performing frequency stabilization at a wavelength of absorption line which shows only a low absorption intensity.

Figure 8:
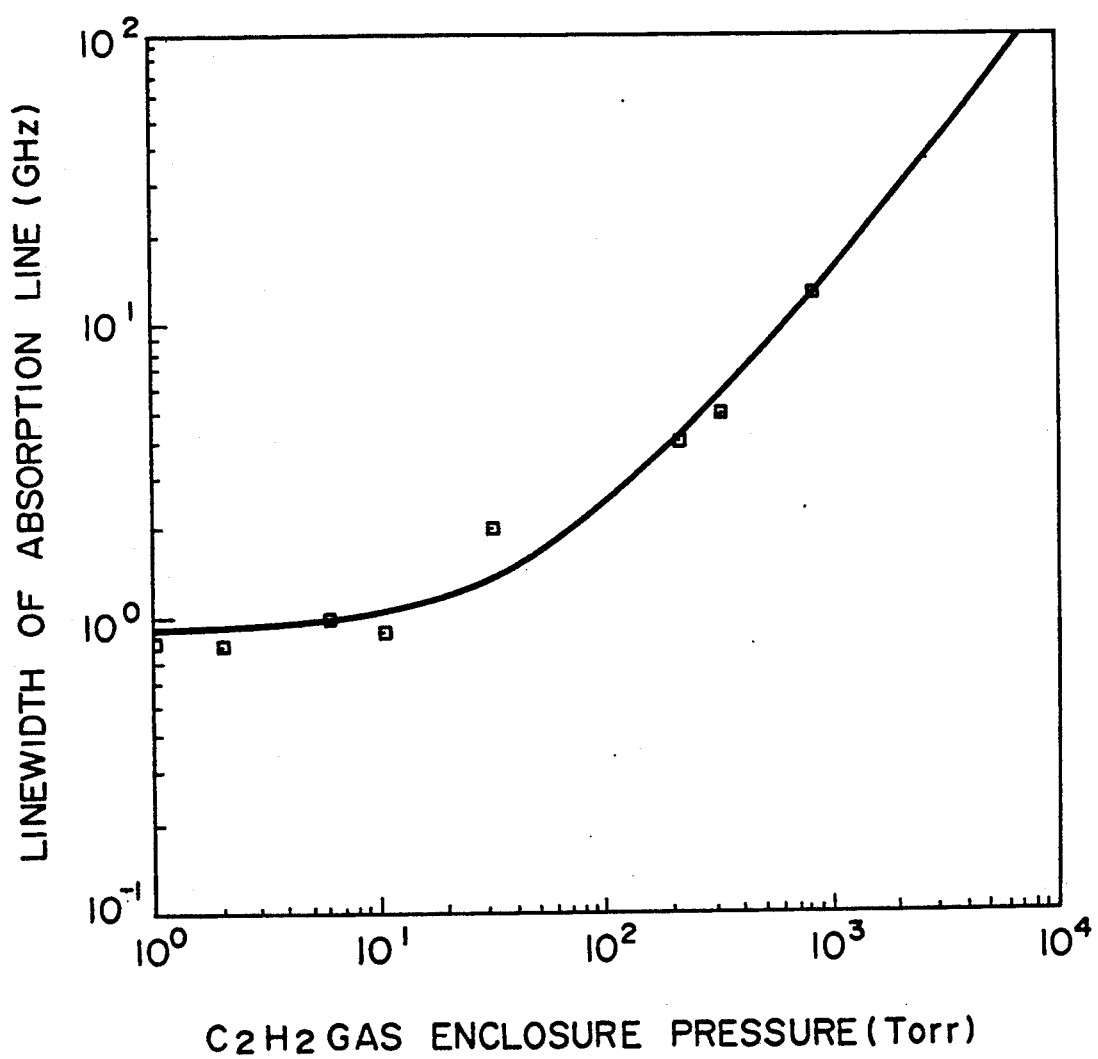
FIG. 8 is a graph illustrating relationship between the pressure at which $^{13}C_2H_2$ gas molecule is enclosed and linewidth of absorption line.

FIG. 8 is a graph illustrating relationship between the pressure (Torr) at which $^{13}C_2H_2$ gas molecule is enclosed and linewidth (GHz) of absorption line (center wavelength: 1.54117 μm). At an enclosure pressure of 760 Torr (1 atm), the linewidth is on the order of 13 GHz (about 1.3 Å). At 100 Torr, it is on the order of 3 GHz, and at no more than 10 Torr, it reaches a substantially constant level of about 1 GHz. Further study revealed that although reduction of enclosure pressure to no more than 1 atm gives sufficient effects, it is sufficient to use absorption line having a linewidth of no more than several GHz in order to stabilize the frequency to a level within a time fluctuation width of no more than several MHz. Therefore, when the pressure at which $^{13}C_2H_2$ gas molecule is enclosed is no more than 100 Torr, frequency stabilization of a level of no more than several MHz is ensured. However, when the enclosure pressure is no more than 1 Torr, the linewidth of absorption line will not decrease so greatly below a level lower than about 1 GHz. The linewidth on the order of 1 GHz is mainly due to Doppler effect accompanied by movement of gas molecules, and the linewidth can be decreased by lowering the temperature of the gas cell. The above-described values are all results obtained by measurement at room temperature (20° C.). Therefore, it is clear that the pressure at which $^{13}C_2H_2$ gas molecule is enclosed in a gas cell for use in the apparatus for stabilizing frequency of a semiconductor laser is preferably from 1 Torr to 100 Torr.

Figure 9:
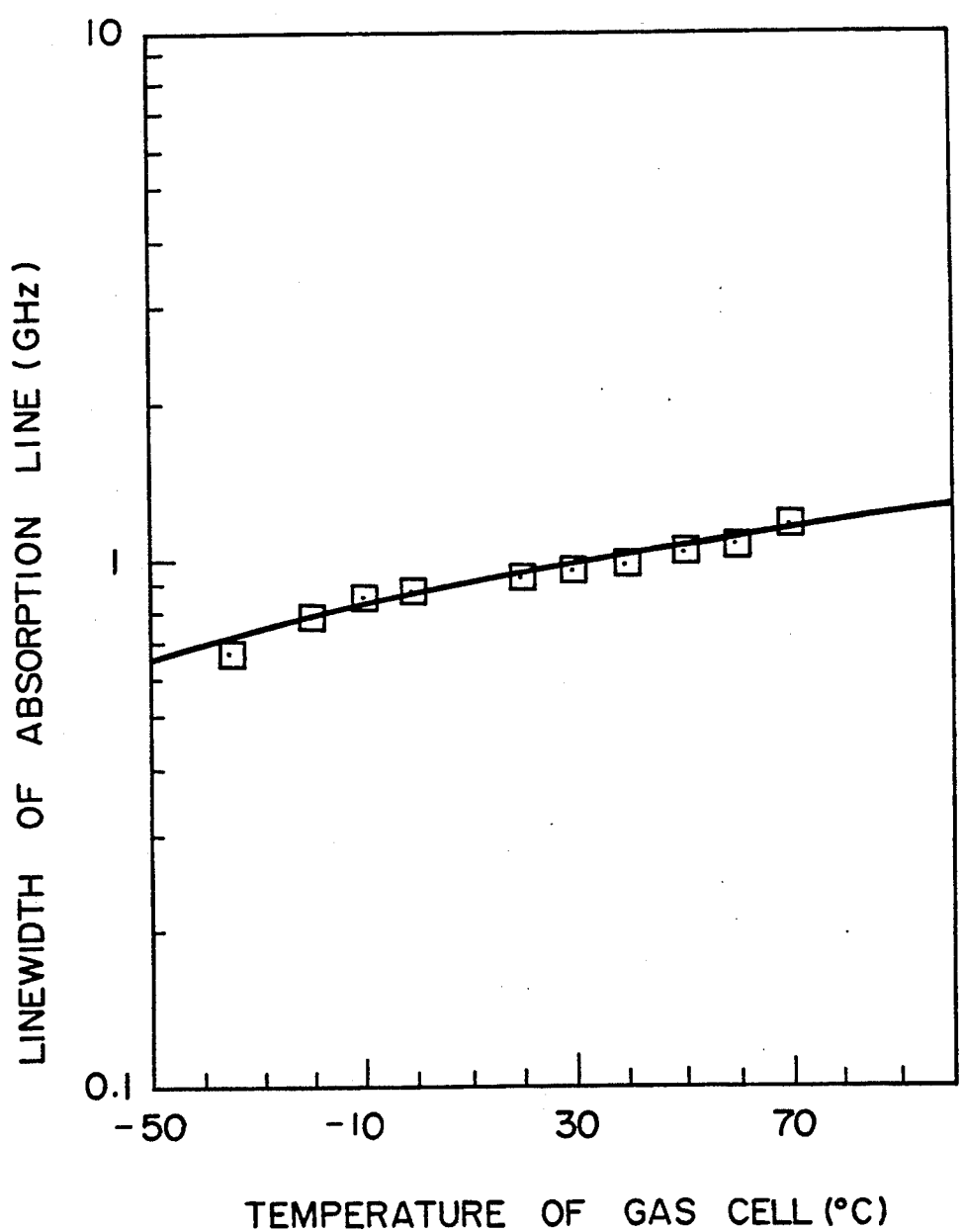
FIG. 9 is a graph illustrating relationship between a temperature of a gas cell enclosing $^{13}C_2H_2$ gas molecule at 20 Torr and line width of absorption line with a wavelength of 1.54117 μm.

FIG. 9 is a graph illustrating relationship between a temperature of a gas cell enclosing $^{13}C_2H_2$ gas molecule at 20 Torr and line width of absorption line with a wavelength of 1.54117 μm. As described above, it is difficult to greatly decrease linewidth of about 1 GHz which is ascribable to Doppler effect even when lowering the pressure at which $^{13}C_2H_2$ gas molecule is enclosed but it is possible to decrease the linewidth by lowering the temperature of the gas cell as shown in FIG. 9. In this embodiment, the linewidth decreases to 0.65 GHz by lowering the temperature of the gas cell to −35° C. Narrowing the linewidth of absorption line means improvement in the accuracy of stabilization upon frequency stabilization of a semiconductor laser as described in the first embodiment of the present invention. In fact, when frequency stabilization is performed using an absorption line of 0.65 GHz (wavelength: 1.54117 μm) obtained at a gas cell temperature of −35° C., frequency stabilization is achieved to a degree of 0.3 MHz in contrast to the first embodiment where degree of stabilization of 0.5 MHz is attained with a linewidth of about 1 GHz. This is not limited to absorption line with a wavelength of 1.54117 μm but all other absorption lines of $^{13}C_2H_2$ gas molecule show temperature dependency of linewidth similar to that shown in FIG. 9. Therefore, it is effective to lower the temperature of the gas cell in order to improve the accuracy of stabilization.

In this embodiment, temperature-dependent change in peak wavelength ($\lambda_o$ in FIG. 5) of absorption line is also measured simultaneously with the measurement of linewidth of absorption line with a wavelength of 1.54117 μm, while changing the temperature of the gas cell from $-35°$ C. to 70° C. In order to increase the accuracy of measurement, comparison is made with absorption line of a gas cell which is maintained at a constant temperature. As the result, it is confirmed that when the temperature is changed from $-35°$ C. to $+70°$ C., the value of the peak wavelength does not change and is constant within a measurement accuracy of 10 MHz. From this it follows that temperature coefficient of peak wavelength of absorption line of $^{13}C_2H_2$ gas molecule is no more than 0.1 MHz/°C.

THIRD EMBODIMENT

The expressions "pressure at which $^{13}C_2H_2$ gas is enclosed" or "enclosure pressure" referred to above may be replaced by an expression "partial pressure of $^{13}C_2H_2$ gas enclosed". That is, the linewidth of absorption line can be decreased substantially, and thus is available in frequency stabilization, even when a gas other than $^{13}C_2H_2$ gas is copresent in the gas cell, as far as the partial pressure of $^{13}C_2H_2$ gas is of the above-described value. The linewidth of absorption line of $^{13}C_2H_2$ gas molecule enclosed in the gas cell at 1 atm varies depending mainly on the following three factors, i.e., (1) collision among the gas molecules themselves,
(2) collision of the gas molecule against the inner wall of the gas cell, and
(3) Doppler effect due to movement of the gas molecules.

When the enclosure pressure is decreased, the linewidth become narrower due to decrease in the factors (1) and (2). The broadening of linewidth due to the factors (1) and (2) can be made smaller or offset also by introducing a gas molecule other than $^{13}C_2H_2$ gas molecule in the gas cell to reduce the partial pressure of $^{13}C_2H_2$ gas molecule (i.e., number of molecules). In this case, however, gas molecule to be mixed is preferably a gas molecule having a molecular weight smaller than $^{13}C_2H_2$ molecule.

In this embodiment, a mixture of helium (He) gas and $^{13}C_2H_2$ gas molecule in a volume proportion of 99:1 is prepared. The partial pressure of $^{13}C_2H_2$ gas molecule is about 7.6 Torr, and this is substantially the same condition as that in a gas cell whose enclosure pressure is reduced to 7.6 Torr. The linewidth of absorption line at 1.54117 μm is about 3 GHz. This value is by about 3 times as large as that obtained with the gas cell enclosing $^{13}C_2H_2$ gas molecule at a reduced pressure of 7.6 Torr (about 1 GHz) as shown in FIG. 8. This difference would be ascribable to effect of collision between He molecule and $^{13}C_2H_2$ molecule However, linewidth on the order of 3 GHz can be utilized in frequency stabilization. In fact, a frequency stabilization degree of 2 MHz is obtained when performing frequency stabilization similar to that in the first embodiment using the mixed gas cell ($^{13}C_2H_2$: 1%, He: 99%).

Linewidth reduction similar to that observed when helium gas is mixed with $^{13}C_2H_2$ gas can also be obtained in the case where helium gas in the mixed gas is replaced by a gas molecule having a molecular weight smaller than that of $^{13}C_2H_2$, and therefore such mixed gases can be used for frequency stabilization of a semiconductor laser. Examples of such smaller molecular weight gas include argon (Ar), neon (Ne), oxygen ($O_2$), nitrogen ($N_2$), hydrogen ($H_2$) and the like.

FOURTH EMBODIMENT

Figure 10:
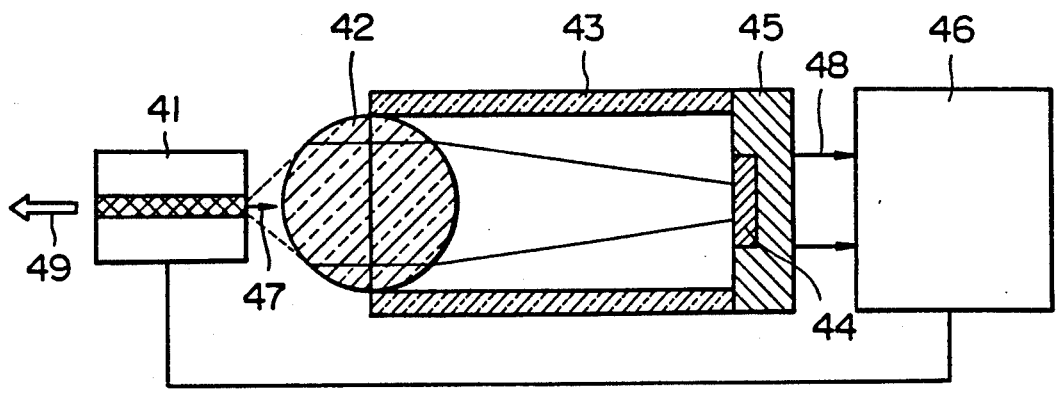
FIG. 10 is a schematic sectional side view of an apparatus for stabilizing frequency of a semiconductor laser according to a fourth embodiment of the present invention.

Various device have been added to the construction of the apparatus of the present invention, particularly to optical absorptional material making use of absorption lines of $^{13}C_2H_2$ molecule. This embodiment will be described in detail with reference to FIGS. 10, 11(a), 11(b) and 11(c). FIG. 10 shows a whole construction of an apparatus for stabilizing frequency of a semiconductor laser according to the fourth embodiment of the present invention.

In FIG. 10, a semiconductor laser 41 launches an output light 47, which is introduced serially to a unitary structure comprising a condenser lens 42, a gas cell 43 for optical absorption, and then a light receptor 45. The condenser lens 42 which is made of glass or plastics and is in the form of a sphere is attached to one end of the gas cell 43 serving as incident or input surface. The gas cell 43 is generally made of glass. The condenser lens 42 functions to condense the output light 47 from the semiconductor laser 41 toward the other end of the gas cell 43 which serves as output surface.

In the gas cell 43 to which the condenser lens 42 is attached on its input surface, there is enclosed an isotope acetylene at a predetermined pressure. At another end of the gas cell 43 which serves as output surface is attached the light receptor 45 generally made of a metal such as iron or brass, preferably brass. The light receptor 45 is provided with a photodetector 44, which may be the same as the photodetector 13 in FIG. 4, including a photoelectric converter such as a semiconductor which can convert the amount of light laser beam received after passing the gas cell 43 and being absorbed of light with a specified wavelength to electric signal 48.

In the variation of this embodiment shown in FIG. 10, the condenser lens 42 and the light receptor 45 are solidly fixed to the respective ends of the gas cell 43 to form a unitary structure. It may be said that the condenser lens 42 and the light receptor 45 serve as stoppers for tightly sealing the gas cell 43. Therefore, the condenser lens 42, the gas cell 43 and the light receptor 45 are well aligned to give an optically stable construction.

Figure 11A:
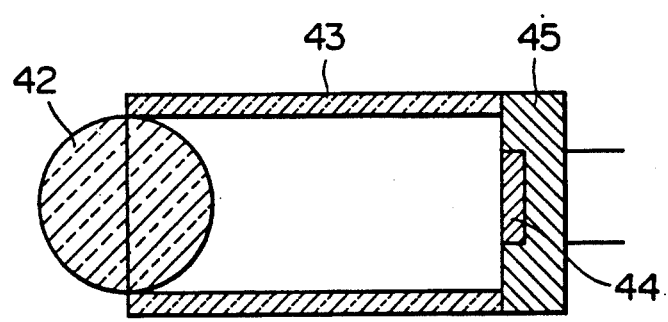
FIG. 11(a) is a schematical side section of a unitary structure comprising a condenser lens, a gas cell, and a light receptor including a photodetector, in which the condenser lens is a spherical lens.
Figure 11B:
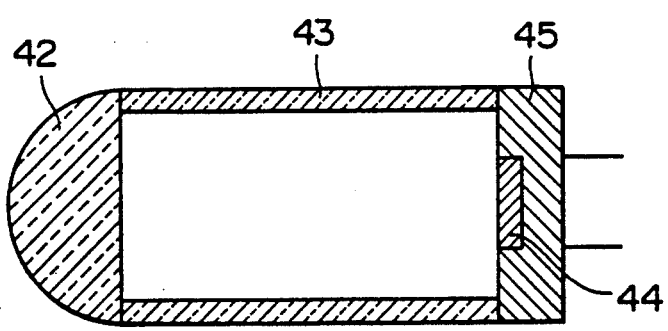
FIG. 11(b) is a schematical side section of a unitary structure comprising a condenser lens, a gas cell, and a light receptor including a photodetector, in which the condenser lens is a hemi-spherical lens.
Figure 11C:
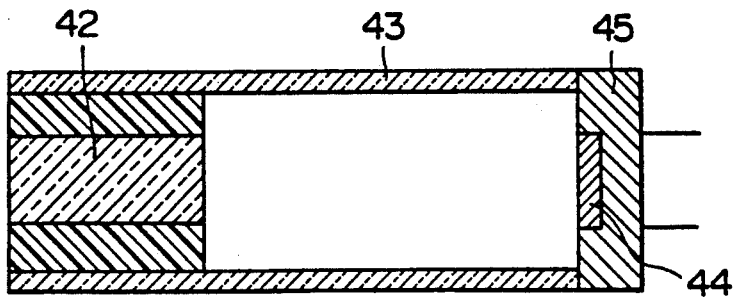
FIG. 11(c) is a schematical side section of a unitary structure comprising a condenser lens, a gas cell, and a light receptor including a photodetector, in which the condenser lens is a rod lens.

FIGS. 11(a), 11(b) and 11(c) are each a schematical side section of the unitary structure comprising the condenser lens 42, the gas cell 43, and the light receptor 45 including the photodetector 44, in which the condenser lens 42 is a spherical lens in FIG. 11(a), a hemispherical lens in FIG. 11(b) or a rod lens in FIG. 11(c).

The variation shown in FIG. 10 uses a spherical lens as the condenser lens 42 as shown in FIG. 11(a) in the unitary structure. However, a hemi-spherical lens as shown in FIG. 11(b) or a rod lens as shown in FIG. 11(c) may also be used in other applications.

In FIGS. 10, 11(a), 11(b) and 11(c), the light receptor 45 is attached to the output surface of the gas cell 43. However, the position at which the light receptor 45 is to be attached is not limited particularly if it is attached to a position near the output surface, i.e., adjacent the output surface.

Now, referring back to FIG. 10, the electric signal 48 obtained after photoelectric conversion by the photodetector 44 in the light receptor 45 is sent to a feedback circuit 46 for frequency stabilization (the same as the control circuit 14 in FIG. 4) to control injection current to the semiconductor laser 41.

As the result, the frequency of the semiconductor laser 41 is synchronized with the wavelength of the absorption line of the isotope acetylene in the gas cell 43, resulting in that frequency stabilization can be performed at that specified wavelength. Thus, a stabilized light is launched from the semiconductor laser 41.

For example, in the case where the apparatus shown in FIG. 10 is constructed by using an InGaAsP distributed feedback (DFB) type semiconductor laser which can oscillate in a 1.541 μm wavelength region as the semiconductor laser 41, and a 2 cm-long gas cell enclosing $^{13}C_2H_2$ gas molecule at 20 Torr as the gas cell 43, and further utilizing absorption line of $^{13}C_2H_2$ gas molecule at 1.54117 μm (half value width: 1 GHz, intensity of absorption: 60%), the frequency of the semiconductor laser 41 can be synchronized with that of the absorption line. Using this system, the fluctuation of center wavelength of a semiconductor laser can be reduced to a level of no more than $0.5 \times 10^{-4}$ Å (optical frequency: 0.5MHz).

FIFTH EMBODIMENT

Subsequently, the fifth embodiment of the present invention in which devices are added to the optical absorptional material will be described in detail. In the same manner as in the fourth embodiment above, the construction of the optical absorptional material enclosing $^{13}C_2H_2$ gas molecule according to this embodiment is intended mainly to increase stability of optical system in the apparatus, reduce the size of the apparatus, improve optical connection with the semiconductor laser, or facilitate control the temperature of the optical absorptional material.

Figure 12A:
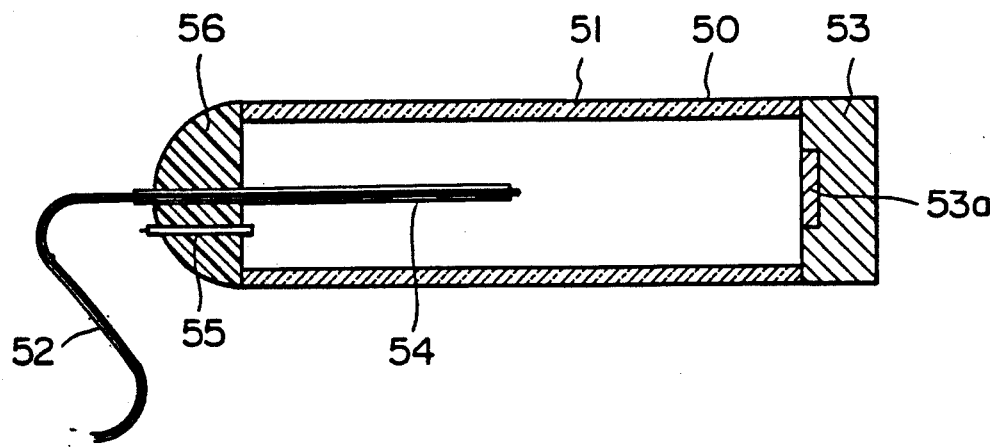
FIGS. 12(a), 12(b) and 12(c) are each a schematical side section of an optical gas cell used in an apparatus for stabilizing frequency of a semiconductor laser according to a fifth embodiment of the present invention.
Figure 12B:
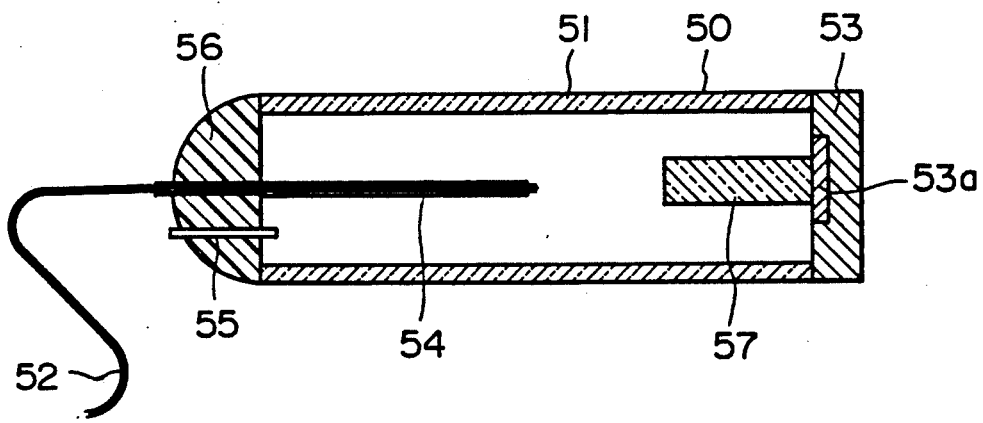
Figure 12C:
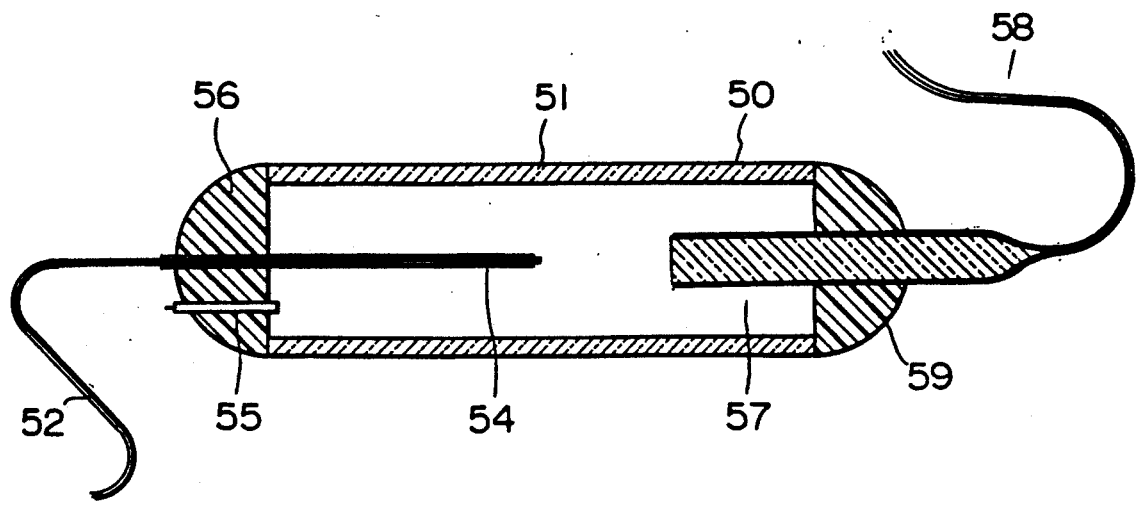

FIGS. 12(a), 12(b) and 12(c) are each a schematical side section of an optical gas cell used in an apparatus for stabilizing frequency of a semiconductor laser according to the fifth embodiment of the present invention. In FIG. 12(a), 51 indicates a hollow glass tube for enclosing an isotope acetylene gas, 52 is an optical fiber for introducing light from a light source or a semiconductor laser (not shown), the optical fiber being preferably covered with an appropriate sheath, 53 is a light receptor, 53a is a photodetector which may be the same as the photodetector 44 in FIGS. 10, 11(a), 11(b) and 11(c). 54 is a hollow glass tube for supporting the optical fiber 52, 55 is a hollow tube generally made of glass for introducing isotope acetylene gas in the gas cell, which is discommunicated as by fusing or with a stopper after introduction of the gas, and 56 is a seal portion for fixing the hollow glass tubes 54 and 55. The seal portion 56 may be made of an adhesive. The hollow glass tube 55 may be omitted and instead an inlet of isotope acetylene gas may be formed directly in the glass tube 51 by processing the glass tube. The light receptor 53 and the photodetector 53a may be the same as the light receptor 45 and the photodetector 44 shown in FIGS. 10, 11(a), 11(b) and 11(c), respectively.

That is, the gas cell 50 for optical absorption is comprised by the hollow glass tube 51 on an incident side opening of which are attached the hollow glass tube 54 and the tube 55 for charging a light absorbing gas (isotope acetylene gas), for example, by sealing them with an adhesive. On the opposite side opening of the tube 51 is air-tightly attached the light receptor 53. An adhesive may be used for fixing the light receptor 53 to the hollow glass tube 51. Then the optical fiber 52 is supported through the hollow glass tube 54 in order to allow light from a light source or semiconductor laser (not shown) to pass inside the cell 50. The tube 55 is adapted to introduce an isotope acetylene gas in the cell 50 to fill it therewith. Of course, the hollow glass tube 54 is sealed with an adhesive or a stopper before the isotope acetylene gas is charged in the cell 50. It is preferred to place the optical fiber 52 straight in the hollow glass tube 54. For this purpose, the optical fiber may be fixed straight (without running in a spiral form) on the inner surface of the tube 54 with an adhesive along its length inside the tube 54.

FIG. 12(b) illustrates a construction of the gas cell 50 according to a variation of the fifth embodiment, in which a glass rod 57 is fixed on one end thereof to the light receptor 53, more particularly to the photodetector 53a, in the gas cell 50 as shown in FIG. 12(a) in such a manner that the optical fiber 52 and the glass rod 57 are substantially in alignment. It is obvious that when the length of the cell 50 is larger, the light output from the optical fiber 52 is spread broadly. However, the addition of the glass rod 57 makes it easier to collect broadly spread light rays as much as possible and can send the light to the light receptor 53 efficiently. In this case, provision of the glass rod 57 with a stepped or graded distribution of diffractive index as shown in FIGS. 13(a), 13(b) and 13(c) makes it possible to transmit light more efficiently.

Figure 13A:
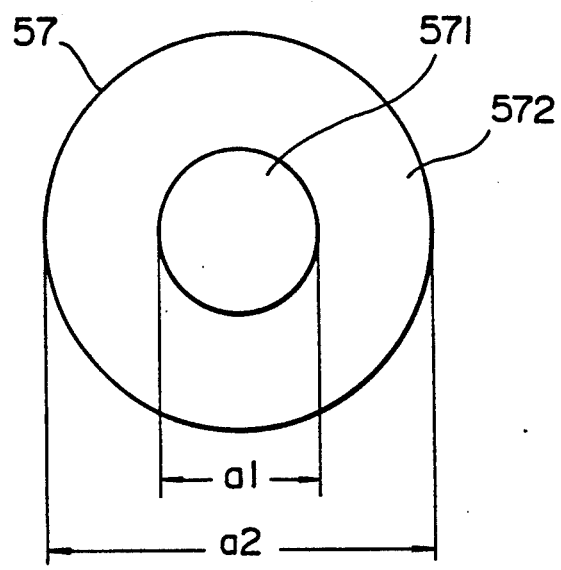
FIG. 13(a) is a transverse cross-section of a glass rod with a distribution of refractive index used in a gas cell according to a fifth embodiment of the present invention.
Figure 13B:
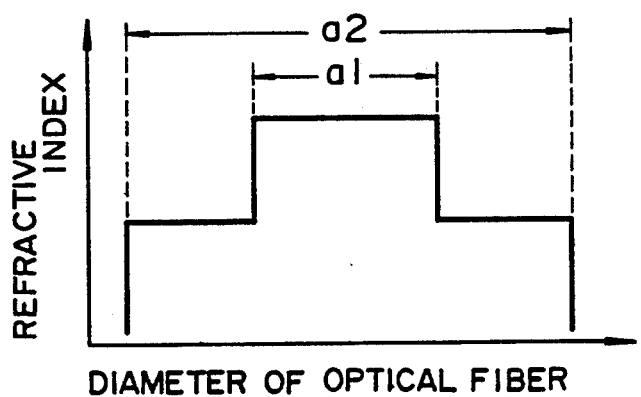
FIG. 13(b) is a graph representing distribution of refractive indices of a core and of a clad of the glass rod shown in FIG. 13(a)
Figure 13C:
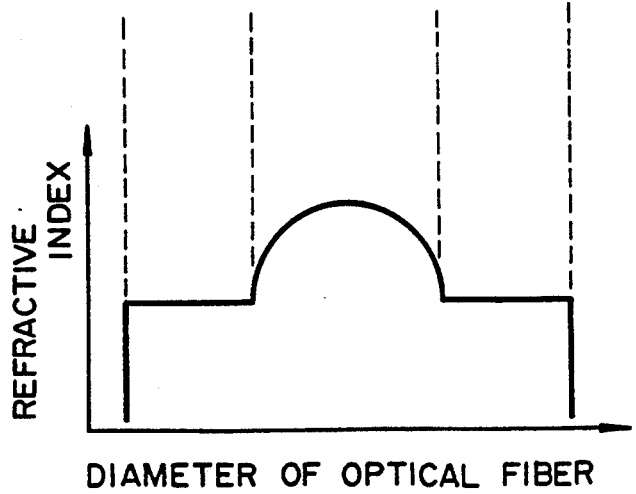
FIG. 13(c) is a graph representing parabolic distribution of refractive index of a core of the glass rod shown in FIG. 11(a)

FIG. 13(a) is a transverse cross-section of the glass rod 57 with a distribution of refractive index. The glass rod 57 is a bi-layer structure which is composed of a core 571 in which light is guided and a clad 572 which is arranged concentrically with the core 571. The diameter ratio $a_1/a_2$ (where $a_1$ is a diameter of the core 571 and $a_2$ is a diameter of the clad 572) may be, for example, 1:3. As for materials for producing the optical fiber with such distribution of refractive index, there can be used the same materials as those used for the production of optical fibers as they are. FIG. 13(b) is a graph showing distribution of refractive indices of the core 571 and of the clad 572. FIG. 13(c) is a graph representing parabolic distribution of refractive index of the core 571.

FIG. 12(c) illustrates a construction of the gas cell 50 according to another variation of the fifth embodiment, in which the glass rod 57 is made of the same material a optical fiber and one end of the rod 57 which is outside of the gas cell 50 is drawn to form a fiber portion 58. This construction makes it possible to obtain output light by means of an optical fiber. Reference numeral 59 indicates a seal portion made by fixing the rod shape terminal 57 of the optical fiber 58 with an adhesive. This construction makes it possible to obtain light which has penetrated through an optical fiber and which has passed the gas cell 50 as output light also from an optical fiber, thus permitting construction of the whole optical system with an optical fiber.

Figure 14A:
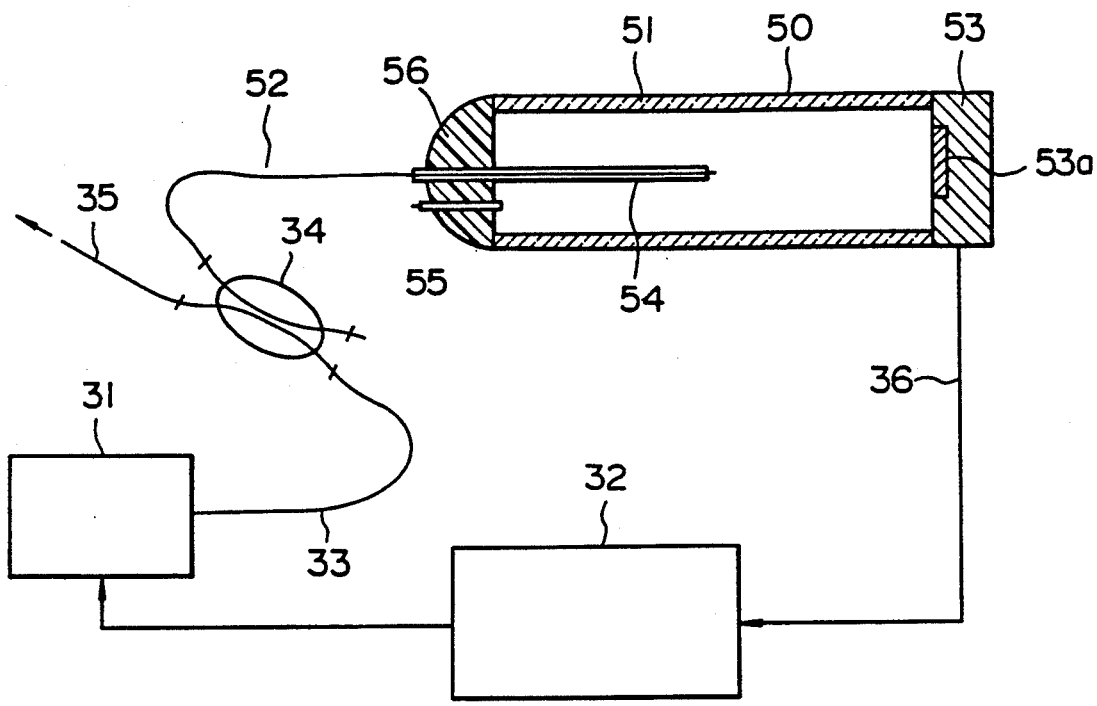
FIGS. 14(a) and 14(b) are block diagrams illustrating constructions of apparatuses for stabilizing frequency of a semiconductor laser according to still another variations of the fifth embodiment of the present invention.
Figure 14B:
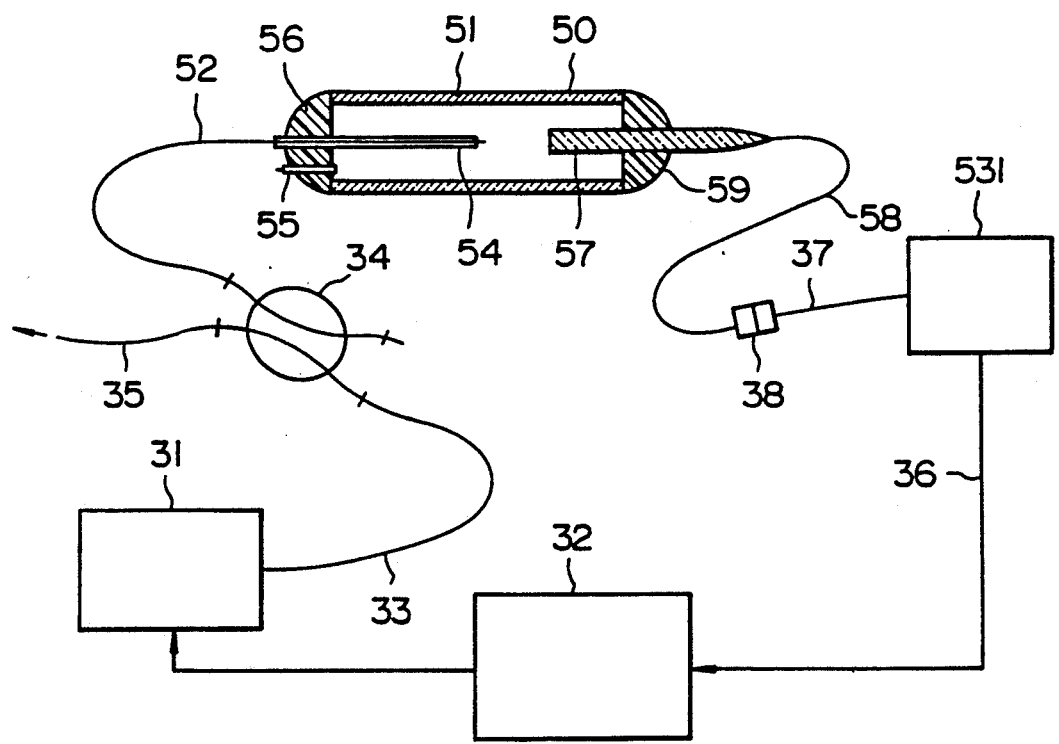

FIGS. 14(a) and 14(b) are block diagrams illustrating the constructions of the apparatuses for stabilizing frequency of a semiconductor laser according to still another variations of the fifth embodiment of the present invention. As shown in FIG. 14(a), the apparatus is comprised by the same gas cell 50 for optical absorption as used shown in FIG. 12(a), a semiconductor laser module 31 from which output light can be obtained through an optical fiber 33, a feedback circuit 32 for stabilizing frequency of a semiconductor laser (not shown), an optical fiber coupler 34 for connecting optically the input optical fiber 52 of the gas cell 50 to the optical fiber 33 so that the optical fibers 52 and 33 are coupled with the optical fiber coupler 34, and one of output lights can be taken out through an optical fiber 35, for example. In FIGS. 14(a) and 14(b), like or equivalent parts or members shown in FIGS. 12(a), 12(b) and 12(c) are indicated by like reference numerals, and detail description thereof is omitted here.

Referring to FIG. 14(a), action of the apparatus for stabilizing frequency of a semiconductor laser using the gas cell 50 for optical absorption according to the fifth embodiment will be described below.

Firstly, output light launched from the semiconductor laser module 31 is sent through the optical coupler 34 and the optical fiber 52 to the gas cell 50 to cause light absorption at a specified wavelength. Then, the intensity of light which has passed through isotope acetylene gas has characteristics as shown in FIG. 5. The frequency of the laser beam is synchronized with the absorption peak wavelength $\lambda_{88}$ in the same manner as described in the previous embodiment. The light transmitted is photoelectrically converted to signal 36 by the light receptor 53 in the gas cell 50. The signal 36 is sent to the feedback circuit 32 (the same as the control circuit 14 in FIG. 4). The injection current to the semiconductor laser module is controlled based on the signal 36, thus making it possible to synchronize the frequency of the semiconductor laser module 31 with the peak wavelength of absorption line of the gas enclosed in the gas cell 50 and stabilize the frequency at the peak wavelength. The frequency-stabilized light can be obtained as output light from the optical fiber 35.

FIG. 14(b) illustrates a block construction in which there is used the fiber-output type gas cell 50 as shown in FIG. 12(c). The construction of this variation is different from the construction shown in FIG. 14(a) in the provision of a fiber-input type light receptor 531 in order to photoelectrically convert output light from the optical fiber 58 at the output terminal of the gas cell 50. Also, there are provided an input fiber 37 for the light receptor 531 and an optical connector 38 for optically connecting the input fiber 37 and the output fiber 58 of the gas cell 50.

For example, in the case where the apparatus shown in FIG. 14(a) or 14(b) is constructed by using an InGaAsP distributed feedback (DFB) type semiconductor laser which can oscillate in a 1.541 μm wavelength region as the semiconductor laser module 31, and a 2 cm-long gas cell enclosing $^{13}C_2H_2$ gas molecule at 20 Torr as the gas cell 50, and further utilizing absorption line of $^{13}C_2H_2$ gas molecule at 1.54117 μm (half value width: 1 GHz, intensity of absorption: 60%), the frequency of the semiconductor laser module 31 is synchronized with the wavelength of the absorption line. Using this system, the fluctuation of center wavelength of a semiconductor laser can be reduced to a level of no more than $0.5 \times 10^{-4}$ Å (optical frequency: 0.5 MHZ).

SIXTH EMBODIMENT

Further, the sixth embodiment of the present invention will be described below, which embodies further improvement on the optical absorptional material. FIG. 15 is a schematical illustration of an apparatus for stabilizing frequency of a semiconductor laser according to the sixth embodiment. In FIG. 15, reference numeral 61 indicates a semiconductor laser, 62 is a light-absorbing fiber whose structure is shown in FIG. 16(a) or 16(b), 63 is a photodetector, 64 is a feedback circuit for frequency stabilization.(hereafter, referred to simply as "feedback circuit", the same circuit as the one shown in FIG. 4), 65 is a drive current terminal for driving a semiconductor laser, 66 is output light from the semiconductor laser 61, 67 is output light after passing the optical absorptional fiber 62, and 68 is a main output light from the semiconductor laser 61.

In FIGS. 16(a) and 16(b), each of which is a transverse cross-section of the optical absorptional fiber 62, reference numeral 612 indicates a clad, 613 is a hollow space formed near or in a core 614. In the hollow space isotope acetylene gas molecules are filled.

Referring to FIGS. 15, 16(a) and 16(b), the action or function of the apparatus for stabilizing frequency of a semiconductor laser according to the sixth embodiment of the present invention will be described below.

Firstly, the output light 66 launched from the semiconductor laser 61 is introduced in the optical absorptional fiber 62 at one end thereof to allow it to pass through the core 614 of the fiber 62 and at the same time interact with the isotope acetylene gas molecules enclosed in the hollow space 613 so that there can occur optical absorption at a specified wavelength. Then the output light 77 from the another end of the optical absorptional fiber is detected by the photodetector 63 to form electric signal, which then is sent to the feedback circuit 64 and lastly to the drive current terminal 65 of the semiconductor laser 61, to modulate the frequency of the semiconductor laser 61 with that of the above-described specified absorption line of the isotope acetylene gas molecule enclosed in the hollow space 614 and stabilizing the frequency at this modulation wavelength.

For example, in the case where the apparatus shown in FIGS. 15 and 16(a) is constructed by using an InGaAsP distributed feedback (DFB) type semiconductor laser which can oscillate at a center wavelength of 1.541 μm as the semiconductor laser 61, $^{13}C_2H_2$ as the isotope acetylene gas, and an optical fiber including a core (614) having a diameter of 8 μm, a hollow space (613) of a diameter of 3 μm and a clad (612) of a diameter of 125 μm as the optical absorptional fiber 62, and further utilizing absorption line of $^{13}C_2H_2$ gas molecule at 1.54117 μm, the frequency of the semiconductor laser 61 can be stabilized. The procedures of frequency stabilization are the same as those described in the preceding embodiments and description thereof is omitted here. As the result, a degree of stabilization of 5 MHz can be achieved using the system described in FIGS. 15 and 16(a).

Similar results can be obtained when using the system shown in FIGS. 15 and 16(b).

Next, explanation will be added on the optical absorptional fiber used in this embodiment. In the case of the optical absorptional fiber shown in FIGS. 16(a) or 16(b), optical absorption characteristics is exhibited by the interaction between the transmitted light guided in the core 614 and isotope acetylene gas molecule enclosed in the hollow space 613 and therefore the leakage of the transmitted light into the hollow space 613 determines the degree of the interaction, i.e., the intensity of the optical absorption which occurs. For example, in the case of the optical absorptional fiber having the construction as shown in FIG. 16(a), strong interaction can be obtained when single-mode transmission of light is achieved with lowering value of V defined by the following equation.

$$V = k n_1 a \sqrt{2\Delta} \quad (1)$$

wherein k is wave number of transmitted light, $n_1$ is refractive index of core, a is radius of core, and $\Delta$ is $(n_1 - n_2)/n_1$ where $n_2$ is refractive index of clad. The sizes of the elements of the optical absorptional fiber described above, i.e., the diameter of the core being 8 μm and the diameter of the hollow space being 3 μm are determined according to the equation (1) above. The values are of course typical ones and can be set up freely depending on the purposes so that the interaction can be increased and high intensity of optical absorption can be obtained.

When $^{13}C_2H_2$ gas molecule is enclosed in the hollow space of the optical absorptional fiber as shown in FIG. 16(a) or 16(b), absorption lines similar to those shown in FIG. 1 are obtained and they are used in frequency stabilization of a semiconductor laser as described above. In the case of the optical absorptional fiber, enclosure pressure at which $^{13}C_2H_2$ gas molecule is enclosed is more important than in the case of using the gas cell. More particularly, the hollow space 613 in the optical absorptional fiber 52 is very small in size as compared with the gas cell but instead the length of the fiber is large (usually 1 m to 10 m), it is difficult to precisely control the enclosure pressure. In view of this, it is particularly useful to use the mixed gas composed of isotope acetylene gas and helium or the like as described in the third embodiment above in order to decrease the partial pressure of the isotope acetylene molecule to achieve the same effect as in the case where the reduction of enclosure pressure is performed. For example, when a mixed gas is prepared which is composed of 1% by volume of $^{13}C_2H_2$ and 99% by volume of He and the mixed gas is enclosed in the hollow space of the optical absorptional fiber, the linewidth of absorption line with a wavelength of 1.54117 μm is on the order of 3 GHz. Hence, in the case of using the optical absorptional fiber, it is effective to use the mixed gas as described above in addition to the enclosure of isotope acetylene gas at reduced pressure.

Figure 17A:
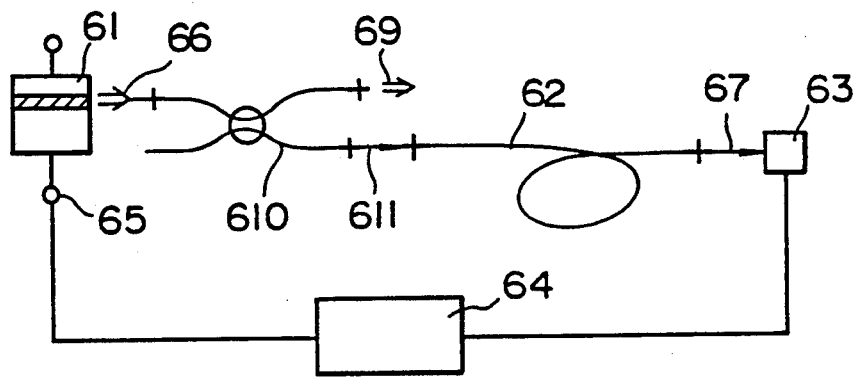
FIGS. 17(a) and 17(b) each are a schematical view diagram illustrating an apparatus for stabilizing frequency of a semiconductor laser according to the sixth embodiment of the present invention.
Figure 17B:
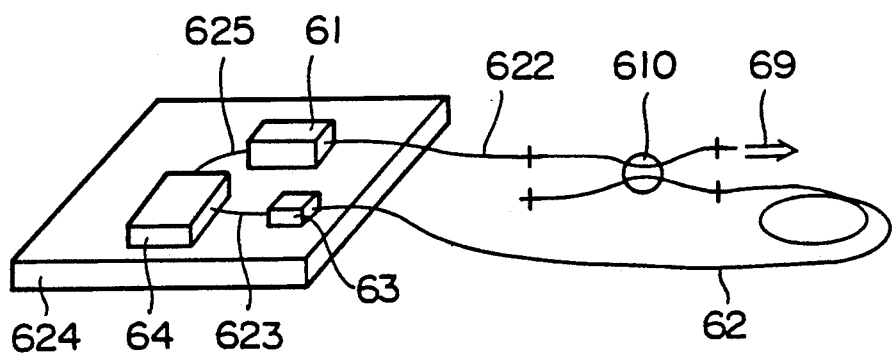

Next, variations of the apparatus for stabilizing frequency of a semiconductor laser according to this embodiment will be explained in which the above-described optical absorptional fiber is used as optical absorptional material. Since it can be bent freely without causing damage or giving adverse effects on light transmission, the optical absorptional fiber opens possibility of constructing systems different from that in which gas cell is used. FIGS. 17(a) and 17(b) show examples of such variation. In FIG. 17(a), the output light 66 launched from the semiconductor laser 61 is introduced to a fiber coupler 610 to divide the output into two light rays, i.e., main output light 69 and output light 611 for frequency stabilization. Ratio of intensities of divided light rays is determined depending on the characteristics of the coupler. Typically, the ratio of the intensity of the main output light 69 to that of the output light 611 is 10:1. Then, the output light 611 is introduced into the optical absorptional fiber 62 to realize sharp optical absorption characteristics and the output light 67 is received by the photodetector 63. The actions of the feedback circuit 64 and the drive current terminal 65 are the same as described in the preceding embodiments. According to this variation, the output light 611 for frequency stabilization can be divided or branched in the same direction as that of the main output light 66, with the result that it is possible to simplify optical alignment such as optical coupling with the optical absorptional fiber or the like.

In the system shown in FIG. 17(b), the semiconductor laser 61 is provided with a so-called pig tail, i.e., a short piece of optical fiber for taking out output light from the semiconductor laser 61. The output light from the semiconductor laser 61 is input directly to the optical fiber coupler 610 via the pig tail 622. The ratio of division by passing through the optical fiber coupler 610 is typically 10 : 1 in the same manner as in the system shown in FIG. 17(a); laser beam in an amount of about 1/10 as much as that of the major output light 69 is input into the optical absorptional fiber 62. The laser beam having passed through the optical absorptional fiber 62 to cause optical absorption to occur is received by the photodetector 63 and converted into electric signal which is sent via a coupling line 623 to the feedback circuit 64 and the resulting control signal is sent to the semiconductor laser 61 via a coupling line 625. The action of the semiconductor laser 61 is the same as those of the same or equivalent elements described in the preceding embodiments.

According to this embodiment, the apparatus can be made compact since the semiconductor laser 61, the photodetector 63 and the feedback circuit 64 are arranged on the board 624. This feature is ascribable to the fact that the direction of the laser beam to be transmitted can be changed freely by using the optical absorptional fiber which may be called an optical-fiber-type light absorbing cell. Use of a semiconductor laser with a pig tail 612 can further simplify and stabilize optical alignment.

SEVENTH EMBODIMENT

Further improvement on the optical absorptional material and the construction of the apparatus for stabilizing frequency of a semiconductor laser will be described below.

Figure 18:
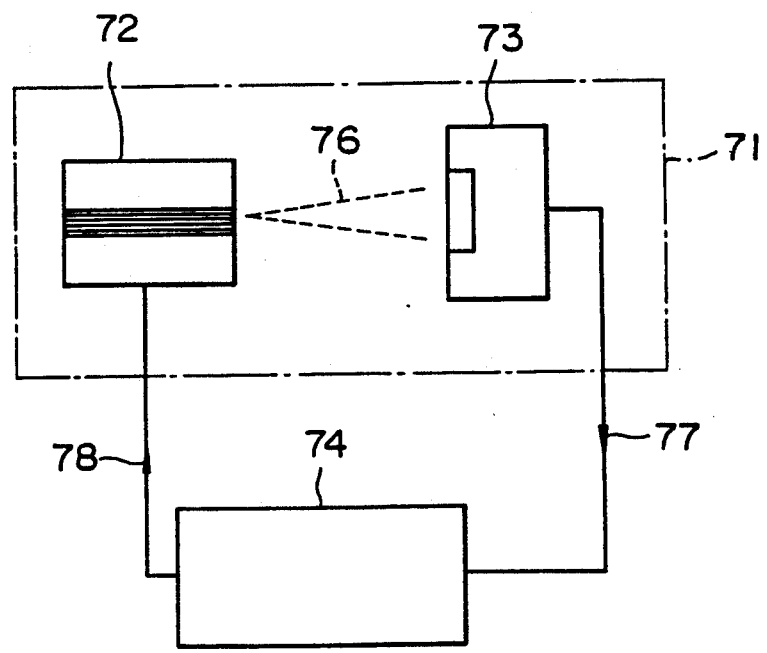
FIG. 18 is a block diagram showing basic construction of the apparatus for stabilizing frequency of a semiconductor laser according to the seventh embodiment of the present invention.

FIG. 18 is a block diagram showing basic construction of the apparatus for stabilizing frequency of a semiconductor laser according to the seventh embodiment of the present invention. In FIG. 18, reference numeral 71 indicates a gas cell enclosing an isotope acetylene gas, 72 is a semiconductor laser, 73 is a light receptor, and 74 is a feedback circuit for frequency stabilization. More particularly, the semiconductor laser apparatus according to this embodiment includes the gas cell 71 in which there are solidly arranged the semiconductor laser 72 and the light receptor 74. The output light 76 from the semiconductor laser 72 passes through the isotope acetylene in the gas cell 71 to cause optical absorption to occur. Utilizing optical absorption at a specified wavelength, the transmitted light is photoelectrically converted to give electric signal, which then is fed to the feedback circuit 74 (the same circuit as the control circuit 14 in FIG. 4) outside the gas cell 71 and processed in the circuit 74 and then fed back to the semiconductor laser 72. Thus, the frequency of the semiconductor laser 72 is stabilized.

Figure 19A:
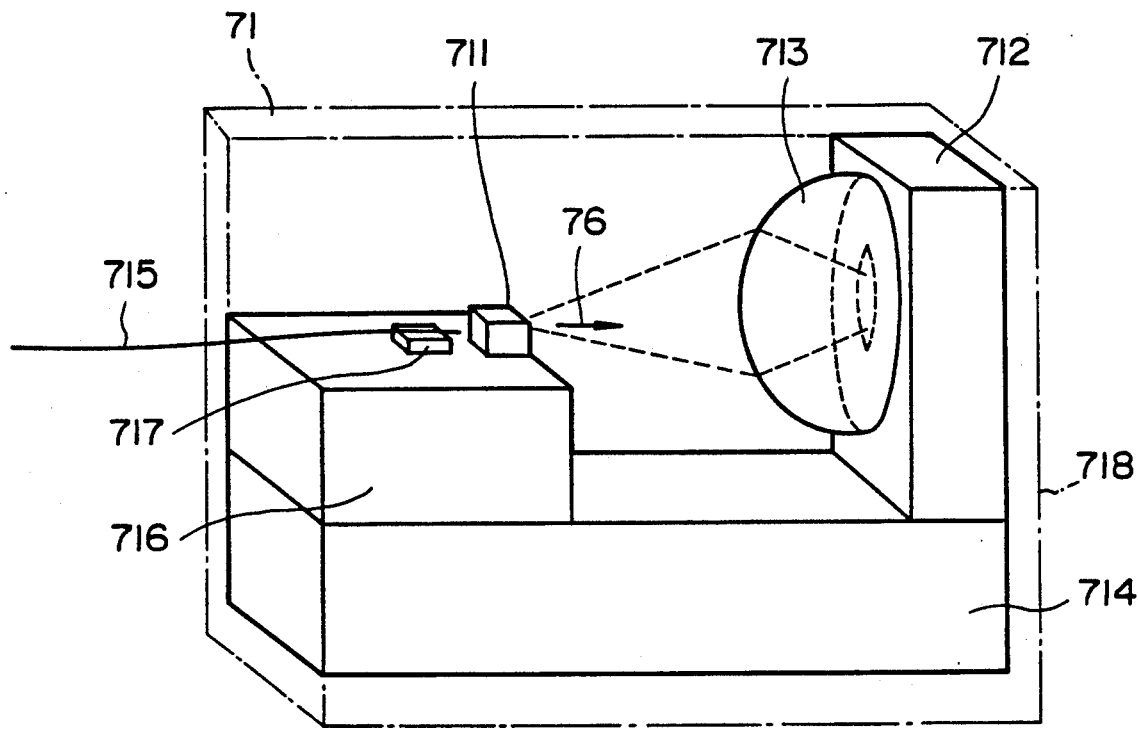
FIG. 19(a) is a schematical perspective view of an apparatus for stabilizing frequency of a semiconductor laser according to a variation of this embodiment, illustrating inner structure of the apparatus.
Figure 19B:
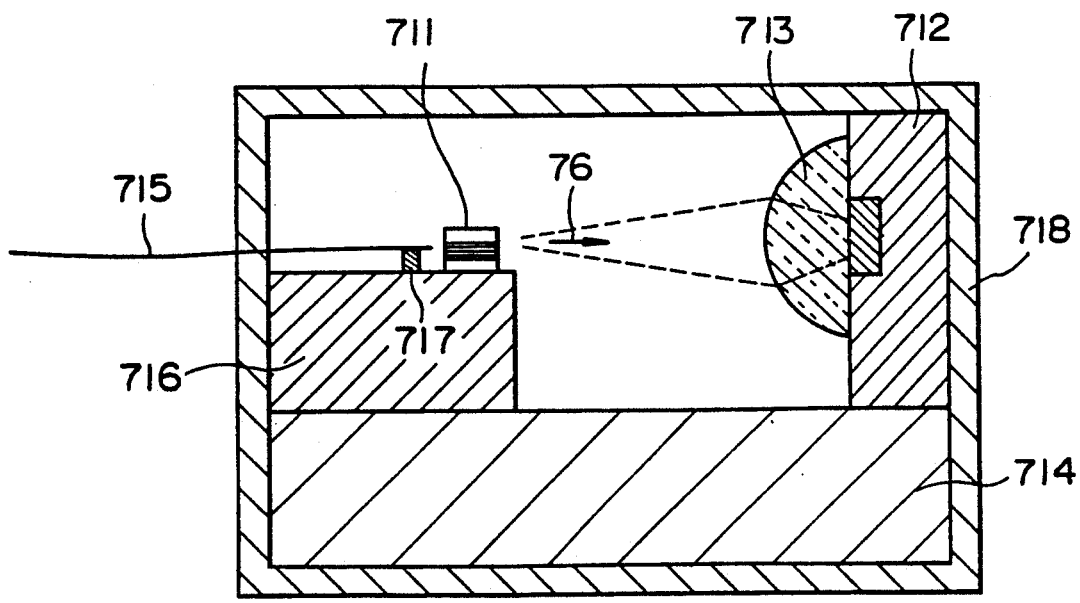
FIG. 19(b) is an elevational cross-section of the apparatus shown in FIG. 19(a)

FIG. 19(a) is a schematical perspective view of an apparatus for stabilizing frequency of a semiconductor laser according to a variation of this embodiment, illustrating inner structure of the apparatus, and FIG. 19(b) is an elevational cross-section of the apparatus shown in FIG. 19(a). In FIGS. 19(a) and 19(b), reference numeral 711 indicates a semiconductor laser which is the same as that shown in FIG. 18, 712 is a light receptor which is the same as that shown in FIG. 18, 712 is a light receptor which is the same as that shown in FIG. 18, 713 is a hemi-spherical lens for condensing laser beam and concentrate on the light receptor 712, and 714 is a Peltier element for controlling the temperature of the semiconductor laser 711 and of light absorbing gas enclosed in the apparatus. The Peltier element produces a detection signal which is sent via communication line to a temperature control device (not shown) for controlling the temperature of the semiconductor laser and that of the gas. Reference numeral 715 is an optical fiber for taking out stabilized light, 716 and 717 are a stand for fixing the semiconductor laser 711 and one for fixing the optical fiber 715, respectively. These elements or members are contained in a box 718 serving as an optical absorption cell made of glass or a metal such as brass and filled with a light absorbing gas, i.e., isotope acetylene gas or a mixed gas containing the same.

Next, referring to FIG. 19(a) and 19(b), explanation will be made on the action of the apparatus for stabilizing frequency of a semiconductor laser using the absorption cell according to this embodiment.

Firstly, the output light 716 produced by the semiconductor laser 711 passes through or transmits the isotope acetylene gas filled in the apparatus to cause optical absorption to occur at a specified frequency. The intensity of light which has transmitted the isotope acetylene gas shows a characteristic curve similar to that shown in FIG. 5. After the frequency of the laser beam is synchronized with the absorption peak wavelength $\lambda_o$, the transmitted light is collected with the hemi-spherical lens 713 and converted photoelectrically by the light receptor 712 to produce electric signal 77 which is sent to the feedback circuit 74 (cf. FIG. 18) and processed therein to produce control signal 78, which controls injection current supplied to the semiconductor laser 711 so that the frequency of the semiconductor laser 711 can be synchronized with the peak wavelength of the absorption line of the isotope acetylene gas in the gas cell, thus stabilizing it at that wavelength. The stabilized light can be obtained as output from the optical fiber 715.

For example, in the case where the apparatus shown in FIG. 19 is constructed by using an InGaAsP distributed feedback (DFB) type semiconductor laser which can oscillate at a wavelength of 1.5410 $\mu$m as the semiconductor laser 711, setting up the length of light pass along which the laser beam transmits, i.e. distance between the semiconductor laser 711 and the hemispherical lens 713 to 2 cm, using $^{13}C_2H_2$ gas molecule at 20 Torr as the gas isotope acetylene gas, and further utilizing absorption line of $^{13}C_2H_2$ gas molecule at 1.54117 $\mu$m (half value width: 1 GHz, intensity of absorption: 60%), the frequency of the semiconductor laser 41 can be synchronized with that of the absorption line. Using this system, the fluctuation of center wavelength of a semiconductor laser can be reduced to a level of no more than $0.5 \times 10^{-4}$ Å (optical frequency: 0.5 MHZ).

EIGHTH EMBODIMENT

As shown in FIG. 1, $^{13}C_2H_2$ gas molecule has a lot of absorption lines in a wavelength region of from 1.52 $\mu$m to 1.55 $\mu$m (of course, also in a wavelength region of longer than 1.55 $\mu$m). As described in the preceding embodiments, the frequency of a semiconductor laser can be stabilized at respective wavelengths of the absorption lines. In addition, utilizing the absorption lines, a plurality of semiconductor lasers which oscillate at different wavelengths.

Figure 20:
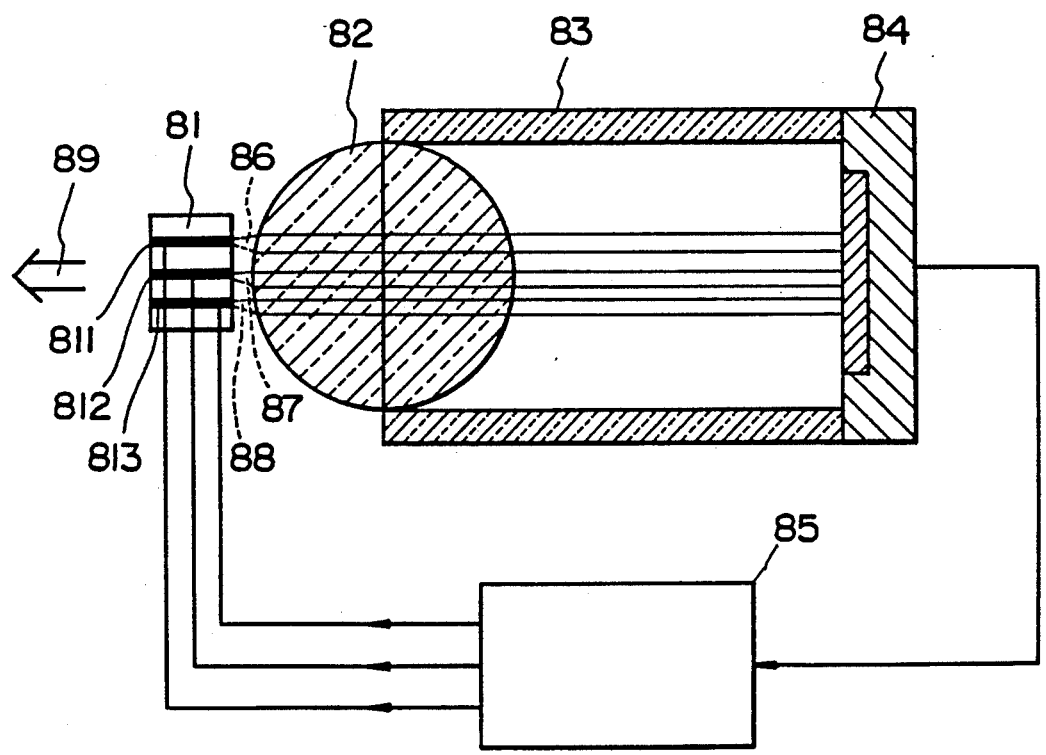
FIG. 20 is a block diagram illustrating an apparatus for stabilizing frequency of a semiconductor laser according to the eighth embodiment of the present invention.

FIG. 20 is a block diagram illustrating an apparatus for stabilizing frequency of a semiconductor laser according to the eighth embodiment of the present invention. In FIG. 20, there is shown a semiconductor laser array 81 in which three semiconductor lasers 811, 812 and 813 with different frequencies are arranged in a row which produce respective output lights 86, 87 and 88, which are introduced into a gas cell 83 for optical absorption having a spherical lens 82 on its incident side and enclosing an isotope acetylene gas at a predetermined pressure or partial pressure, thus allowing optical absorption to occur. Thereafter, the transmitted lights are converted photoelectrically by a light receptor 84 to produce corresponding electric signals which are then input to a control circuit 85. In the control circuit 85, respective drive currents for semiconductor lasers are slightly modulated their respective amplitudes with different modulation currents with cycles $\omega_1$, $\omega_2$ and $\omega_3$, respectively, and the resulting modulated currents are each applied to a d.c. drive current of a predetermined intensity to produce three different modulated-current-applied drive currents are supplied to the corresponding semiconductor lasers 811, 812, 813. As the result, it is possible to separate from among signals obtained by photoelectric conversion by the single light receptor 84 each control signal which corresponds to each semiconductor laser and amplify the each control signal by using a synchronism amplifier (lock-in-amplifier). Thus, the semiconductor lasers 811, 812 and 813 with different frequencies can be stabilized to different specified wavelengths of the isotope acetylene gas. Main output light 89 from the semiconductor laser array 81 contain three kinds of stabilized lights which are stabilized to three different specified wavelengths.

For example, in the case where the apparatus shown in FIG. 20 is constructed by using a semiconductor laser array comprising three InGaAsP distributed feedback (DFB) type semiconductor lasers which can oscillate at wavelengths 1.539 $\mu$m, 1.541 $\mu$m and 1.542 $\mu$m as the semiconductor laser array 81, and a 2 cm-long gas cell enclosing $^{13}C_2H_2$ gas molecule at 20 Torr as the gas cell 83, the frequencies of the semiconductor laser can be stabilized to wavelengths of 1.53959 $\mu$m, 1.54117 $\mu$m and 1.54255 $\mu$m, respectively. In the above case, the cycles used for distinguishing the control signals of semiconductor lasers in the control circuit are $\omega_1 = 1$ KHz, $\omega_2 = 10$ KHz and $\omega_3 = 100$ KHz, respectively.

In the above description, explanation has been made on a variation in which there is used an array including 3 semiconductor lasers. However, arrays with 2 semiconductor lasers or with more than 4 semiconductor lasers may also be used. Also, the plural semiconductor lasers may be stabilized with respect to their frequencies simultaneously or separately. In other words, a plurality of semiconductor lasers whose number is as large as the number of absorption lines of the isotope acetylene gas molecule can be stabilized for their frequencies either simultaneously or separately.

Furthermore, upon stabilizing the frequencies of a plurality of semiconductor lasers, the gas cell provided with a spherical lens used in the above-described variation may be replaced by one of the optical absorptional material in the form of gas cell, gas cell with an optical fiber or optical absorptional fiber, or Hermetic seal type one, used in the preceding embodiments.

Also, the optical absorptional material may enclose non-isotope acetylene molecule ammonia molecule, isotope ammonia molecule or the like so that the frequency of a semiconductor laser or semiconductor lasers can be stabilized at more wavelengths.

NINTH EMBODIMENT

In this embodiment description will be made on an apparatus for stabilizing frequency of a semiconductor laser using an optical frequency modulator in order to vibrate the wavelength of the semiconductor laser on the order of several tens MHz.

Figure 21:
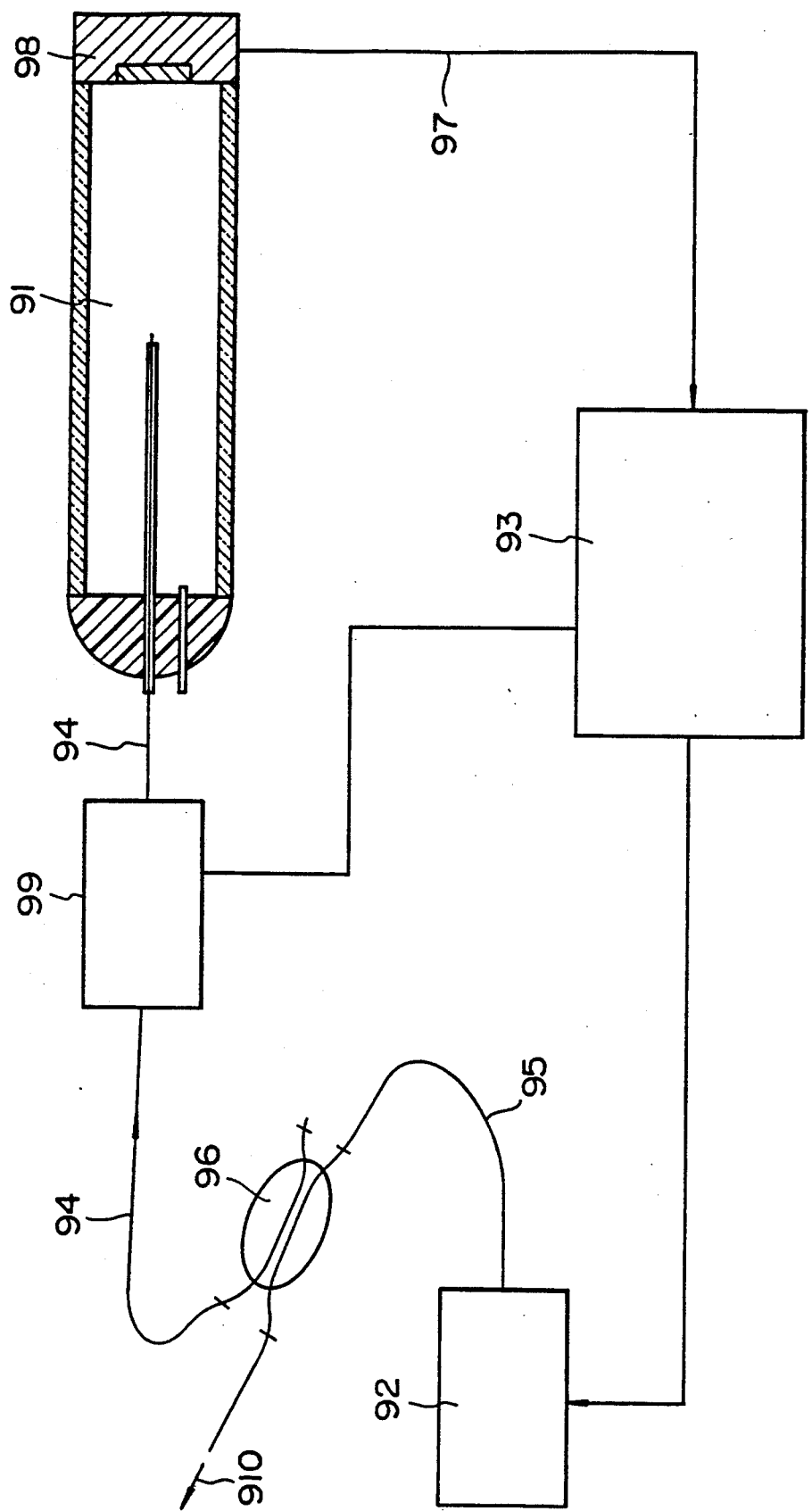
FIG. 21 is a block diagram illustrating an apparatus for stabilizing frequency of a semiconductor laser according to the ninth embodiment of the present invention.

FIG. 21 is a block diagram illustrating an apparatus for stabilizing frequency of a semiconductor laser according to the ninth embodiment of the present invention. In FIG. 21, reference numeral 91 is an optical absorptional material enclosing an isotope acetylene gas, 92 is a semiconductor laser, 93 is a control circuit, 94 and 95 each are an optical fiber, 96 is an optical fiber coupler, 97 is a communication line, 98 is a light receptor, 99 is an optical frequency modulator, and 910 is main output light.

The feature of this apparatus is in that in addition to the optical frequency modulator 99 provided with an optical fiber, the gas cell 91 provided with an optical fiber described with respect to the sixth embodiment above is used so that the semiconductor laser 92 can be optically connected to the optical frequency modulator 99 and the optical absorptional material 91 via the optical fibers 94 and 95.

In FIG. 21, output light from the semiconductor laser 92 passes through the optical fiber 95 and then is divided by the optical fiber coupler 96 into the main output light 910 and light which enters the optical fiber 94. The division (branching) ratio is about 10 : 1. The light having entered the optical fiber 94 is subjected to modulation (several tens MHz) of its optical frequency by the optical frequency modulator 99, and then passes through the optical fiber 94 to enter the optical absorptional material 91 enclosing an isotope acetylene gas molecule, where optical absorption occurs at specified wavelengths specific to the isotope acetylene gas molecule, and light which has been transmitted is then subjected to photoelectric conversion by the light receptor 98 to produce electric signal, which is sent via the communication line 97 to the control circuit 93. After amplification in the control circuit 93, the electric signal is fed back to the semiconductor laser 92 as change in the d.c. drive current. By operating a cycle of feedback circuit, the frequency of the semiconductor laser 92 can be modulated with that of specified absorption line of the isotope acetylene gas enclosed in the optical absorptional material.

For example, the apparatus is operated using a distributed feedback type semiconductor laser which oscillates at a wavelength of 1.54117 $\mu$m as the semiconductor laser 91, an LiNbO$_3$-optical frequency modulator as the optical fiber modulator 99, and $^{13}C_2H_2$ gas as the isotope acetylene gas in the optical absorptional material 91 and subjecting the light from the semiconductor laser to frequency modulation with an LiNbO$_3$ at a width of 50 MHz and repetition rate of 100 KHz, and allowing optical absorption at a wavelength of 1.54117 $\mu$m with $^{13}C_2H_2$ gas molecule. In this case, the frequency of semiconductor laser can be stabilized with a precision of no more than 0.5 MHz. In the construction where optical frequency modulator is included, the main output light from the semiconductor laser contains no noise.

In the same manner as above, a plurality of semiconductor lasers including the one in the form of array as described in the eighth embodiment above can readily be stabilized simultaneously or separately using one or more optical frequency modulators together with on or more optical absorptional materials.

It is also possible to obtain absorption lines with narrower linewidths by lowering the temperature of the optical absorptional material.

As will be apparent from the above-described description, the method and apparatus for stabilizing frequency of a semiconductor laser according to the present invention makes it possible to obtain a lot of intense, sharp absorption lines in a wavelength region of from 1.52 $\mu$m to 1.57 $\mu$m by using an isotope acetylene molecules as an optical absorptional material and therefore the present invention is advantageous in that it can provide a method and apparatus for stabilizing frequency of a semiconductor laser in a wavelength region of from 1.54 $\mu$m to 1.57 $\mu$m which is very important in optical communication techniques, optical measurement techniques and the like.

Since absorption lines of isotope acetylene molecules at a wavelength region of from 1.52 $\mu$m to 1.57 $\mu$m are intense and sharp, the method and apparatus of the present invention can achieve frequency stabilization of a semiconductor laser with high precision and in addition, utilizing a plurality of absorption lines According to the present invention, it is also clear that frequency-stabilized light with much less frequency noise can be obtained by an optically stable system.

Furthermore, the apparatus for stabilizing frequency of a semiconductor laser according to the present invention can be made simple and compact since gas cell can be made shorter by using an isotope acetylene molecule which has intense, sharp absorption lines. also, use of shorter gas cell can stabilize light pass and therefore, very small, highly stable practical apparatus can be provided when further integration of electric circuits is achieved.

The apparatus for stabilizing frequency of a semiconductor laser with reduced size according to the present invention can be applied widely as optical frequency (wavelength) reference device in optical technologies like. quarts-type frequency reference device as in electric technologies. Therefore, the present invention is effective in further development and improvement o optical technologies in general and of communication service centering around telephone, and in reduction of costs incurred to such technologies and service.

What is claimed is:

1. A semiconductor laser apparatus including means for stabilizing the frequency thereof, said apparatus comprising:

a semiconductor laser means for emitting light;
a frequency modulating means for frequency modulating a light output from said semiconductor laser means;
an optical energy absorbing medium for absorbing optical energy, said optical energy absorbing medium being enclosed within a space such that frequency modulated light output from said frequency modulating means is incident on said optical energy absorbing medium;
photodetector means for converting said frequency modulated light transmitted through said optical energy absorbing medium to an electrical signal; and control circuit means for stabilizing the frequency of light output from said semiconductor laser means in response to said electrical signal output from said photodetector means;

wherein said optical energy absorbing medium comprises acetylene gas enclosed within said space, and wherein among carbon and hydrogen atoms of which molecules of said acetylene as are comprised, at least one atom is of a selected isotope.

2. An apparatus in accordance with claim 1, wherein said acetylene gas enclosed within said space is under a reduced pressure of no more than 1 atm.

3. An apparatus in accordance with claim 1, wherein said optical energy absorbing medium comprises a mixtures of said acetylene gas and at least one component selected from the group consisting of helium gas, neon gas, argon gas, oxygen gas, nitrogen gas and hydrogen gas.

4. An apparatus in accordance with claim 3, comprising an optical fiber including a core and a cladding, said optical fiber having a closed hollow area within said core which defines said space, and wherein said optical energy absorbing medium is enclosed within said closed hollow area of said optical fiber under a predetermined pressure.

5. An apparatus in accordance with claim 1, comprising an optical fiber including a core and a cladding, said optical fiber having a closed hollow area within said core which defines said space, and wherein said optical energy absorbing medium is enclosed within said closed hollow area of said optical fiber under a predetermined pressure.

6. An apparatus in accordance with claim 3, comprising an optical fiber including a core and a cladding, said optical fiber comprising a closed hollow area adjacent to said core which defines said space, and wherein said optical energy absorbing medium is enclosed within said closed hollow area of said optical fiber under a predetermined pressure.

7. An apparatus in accordance with claim 1, comprising an optical fiber including a core and a cladding, said optical fiber having a closed hollow area adjacent to said core which defines said space, and wherein said optical energy absorbing medium is enclosed within said closed hollow area of said optical fiber under a predetermined pressure.

8. An apparatus in accordance with claim 1, wherein at least one of said semiconductor laser means and said photodetector means is provided within said space enclosing said optical energy absorbing medium.

9. An apparatus in accordance with claim 1, comprising a cell which defines said space and which encloses said optical energy absorbing medium, said cell comprising a condenser lens located on an input-surface thereof on which said frequency modulated light is incident, and wherein said photodetector means is located directly on an output-surface of said cell from which said frequency modulated light is output.

10. An apparatus in accordance with claim 1, comprising a cell which defines said space and which encloses said optical energy absorbing medium, said cell comprising a condenser lens located on an input-surface thereof on which said frequency modulated light is incident, and wherein said photodetector means is located adjacent to an output-surface of said cell from which said frequency modulated light is output.

11. An apparatus in accordance with claim 1, further comprising:
a cell defining said space and which encloses said optical energy absorbing medium;
at least one input optical fiber for inputting said frequency modulated light to said cell; and
at least one output optical fiber for outputting said frequency-modulated light from within said cell; and
wherein said at least one input optical fiber and said at least one output optical fiber are connected to said cell.

12. An apparatus in accordance with claim 1, wherein said semiconductor laser means, said frequency modulating means and said photodetector means are respectively provided with at least one of at least one input optical fiber for inputting light and at least one output optical fiber for outputting light.

13. A method for stabilizing the frequency of a semiconductor laser apparatus, comprising:
frequency modulating a light output of a semiconductor laser;
enclosing an optical energy absorbing medium, for absorbing optical energy, within a space such that frequency modulated light output from said frequency modulating means is incident on said optical energy absorbing medium;
converting said frequency modulated light transmitted through said optical energy absorbing medium to an electrical signal; and
stabilizing the frequency of light output from said semiconductor laser means, by means of a control circuit, in response to said electrical signal output from said photodetector means;
wherein said optical energy absorbing medium comprises acetylene gas enclosed within said space, and wherein among carbon and hydrogen atoms of which molecules of said acetylene gas are comprised, at least one atom is of a selected isotope.

14. A method in accordance with claim 13, comprising maintaining said acetylene gas enclosed within said space under a reduced pressure of no more than 1 atm.

15. A method in accordance with claim 13, wherein said optical energy absorbing medium comprises a mixture of said acetylene gas and at least one component selected from the group consisting of helium gas, neon gas, argon gas, oxygen gas, nitrogen gas and hydrogen gas.

16. An apparatus in accordance with claim 15, comprising an optical fiber including a core and a cladding, and wherein said enclosing step comprises enclosing said optical energy absorbing medium within a closed hollow area within said core of said optical fiber under a predetermined pressure, said closed hollow area defining said space.

17. An apparatus in accordance with claim 13, comprising an optical fiber including a core and a cladding, and wherein said enclosing step comprises enclosing said optical energy absorbing medium within a closed hollow area within said core of said optical fiber under a predetermined pressure, said closed hollow area defining said space.

18. A method in accordance with claim 15, comprising an optical fiber including a core and a cladding, and wherein said enclosing step comprises enclosing said optical energy absorbing medium within a closed hollow area adjacent said core of said optical fiber under a predetermined pressure, said closed hollow area defining said space.

19. A method in accordance with claim 13, comprising an optical fiber including a core and a cladding, and wherein said enclosing step comprises enclosing said optical energy absorbing medium within a closed hollow area adjacent said core of said optical fiber under a predetermined pressure, said closed hollow area defining said space.

20. An apparatus in accordance with claim 1, comprising providing said semiconductor laser apparatus with at least one of at least one input optical fiber for inputting light and at least one output optical fiber for outputting light.

* * * * *

UNITED STATES PATENT AND TRADEMARK OFFICE
CERTIFICATE OF CORRECTION

PATENT NO. : 5,025,448
DATED : June 18, 1991
INVENTOR(S) : SUDO et al

It is certified that error appears in the above-identified patent and that said Letters Patent is hereby corrected as shown below:

Column 3, line 68 (last line), delete "long gas cell en".

Column 6, line 51, change "ca" to read --can--.

Column 7, lines 7 and 8, arrange the equation on a single line to read:

$$Ca^{13}C_2 + 2H_2O \rightarrow {}^{13}C_2H_2 + Ca(OH)_2 + 33.07 \text{ Kcal/mol}$$

Column 7, lines 24 and 25, arrange the equation on a single line to read:

$$CaC_2 + H_2O + D_2O \rightarrow C_2HD + CaO_2HD + 30.05 \text{ Kcal/mol}$$

Column 7, line 46, change "no" to read --not--.

Column 8, line 39, change "frequency" to read --wavelength--.

Column 8, line 56, change "$\lambda_{88}$" to read --$\lambda_o$--.

Column 14, line 49, change "a" to read --as--.

Column 15, line 23, change "$\lambda_{88}$" to read --$\lambda_o$--.

Column 22, line 7, change "on" to read --one--.

Column 22, line 49, change "o" to read --of--.

UNITED STATES PATENT AND TRADEMARK OFFICE
CERTIFICATE OF CORRECTION

PATENT NO. : 5,025,448
DATED : June 18, 1991
INVENTOR(S) : SUDO et al It is certified that error appears in the above-identified patent and that said Letters Patent is hereby corrected as shown below:

Column 23, line 10 (Claim 1), change "as" to read --gas--.

In the drawings:

In Fig.5, change the label "FREQUENCY" to

--WAVELENGTH--.

Signed and Sealed this

Twentieth Day of April, 1993

*Attest:*

MICHAEL K. KIRK

*Attesting Officer*     *Acting Commissioner of Patents and Trademarks*